US008309953B2

(12) United States Patent
Tessler et al.

(10) Patent No.: US 8,309,953 B2
(45) Date of Patent: Nov. 13, 2012

(54) TRANSISTOR STRUCTURES AND METHODS OF FABRICATION THEREOF

(75) Inventors: Nir Tessler, Zichron Yaakov (IL); Moti Margalit, Zichron Yaaqov (IL); Oded Globerman, Even Yehuda (IL); Roy Shehhar, Mevasseret Zion (IL)

(73) Assignee: Technion Research and Development Foundation Ltd., Technion (IL)

( * ) Notice: Subject to any disclaimer, the term of this patent is extended or adjusted under 35 U.S.C. 154(b) by 553 days.

(21) Appl. No.: 12/160,295

(22) PCT Filed: Jan. 9, 2007

(86) PCT No.: PCT/IL2007/000025
§ 371 (c)(1),
(2), (4) Date: Jul. 8, 2008

(87) PCT Pub. No.: WO2007/080575
PCT Pub. Date: Jul. 19, 2007

(65) Prior Publication Data
US 2009/0008634 A1    Jan. 8, 2009

Related U.S. Application Data

(60) Provisional application No. 60/756,997, filed on Jan. 9, 2006.

(51) Int. Cl.
*H01L 35/24* (2006.01)
(52) U.S. Cl. .................... 257/40; 257/E51.001

(58) Field of Classification Search .............. 257/40, 257/E51.001
See application file for complete search history.

(56) References Cited

U.S. PATENT DOCUMENTS

| 7,879,678 B2 | 2/2011 | Jain |
| 2004/0113152 A1 | 6/2004 | Kim et al. |
| 2004/0222412 A1 | 11/2004 | Bai et al. |
| 2004/0241900 A1 | 12/2004 | Tsukamoto et al. |
| 2005/0139821 A1* | 6/2005 | Park ........................ 257/40 |

FOREIGN PATENT DOCUMENTS

| CN | A-1558932 | 12/2004 |
| EP | 1 385 218 A1 | 1/2004 |
| EP | 1 449 887 A1 | 8/2004 |
| EP | 1 562 240 A2 | 8/2005 |

OTHER PUBLICATIONS

Sirringhaus et al., "Integrated Optoelectronic Devices Based on Conjugated Polymers," *Science*, vol. 280, pp. 1741-1743, Jun. 12, 1998.
Stutzmann et al., "Self-Aligned, Vertical-Channel, Polymer Field-Effect Transistors," *Science*, vol. 299, pp. 1881-1884, Mar. 21, 2003.

(Continued)

*Primary Examiner* — Anthony Ho
(74) *Attorney, Agent, or Firm* — Oliff & Berridge, PLC

(57) ABSTRACT

An electronic device is presented, such as a thin film transistor. The device comprises a patterned electrically-conductive layer associated with an active element of the electronic device. The electrically-conductive layer has a pattern defining an array of spaced-apart electrically conductive regions. This technique allows for increasing an electric current through the device.

44 Claims, 19 Drawing Sheets

OTHER PUBLICATIONS

Tanaka et al., "Vertical- and Lateral-Type Organic FET Using Pentacene Evaporated Films," *Electrical Engineering in Japan*, vol. 149, No. 2, pp. 43-48, 2004.

Nishizawa et al., "Field-Effect Transistor Versus Analog Transistor (Static Induction Transistor)," *IEEE Transactions on Electron Devices*, vol. ED-22, No. 4, pp. 185-197, Apr. 1975.

Ma et al., "Unique architecture and concept for high-performance organic transistors," *Applied Physics Letters*, vol. 85, No. 21, pp. 5084-5086, Nov. 22, 2004.

Smirnov et al., "Technology for nanoperiodic doping of a metal-oxide-semiconductor field-effect transistor channel using a self-forming wave-ordered structure," *Nanotechnology*, Vo. 14, pp. 709-715, 2003.

Bo et al., "Pentacene-carbon nanotubes: Semiconducting assemblies for thin-film transistor applications," *Applied Physics Letters*, vol. 87, pp. 203510-1-203510-3, 2005.

Gates et al., "Unconventional Nanofabrication," *Annual Review of Materials Research*, vol. 34, pp. 339-372, 2004.

Lopes et al., "Hierarchical self-asembly of metal nanostructures on diblock copolymer scaffolds," *Nature*, vol. 414, pp. 735-738, Dec. 13, 2001.

Stoykovich et al., "Directed Assembly of Block Copolymer Blends into Nonregular Device-Oriented Structures," *Science*, vol. 308, pp. 1442-1446, Jun. 3, 2005.

Park et al., "Characteristics of perylene-based organic thin-film transistor with octadecyltrichlorosilane monolayer," *Journal of Vacuum Science & Technology*, vol. B23, No. 3, pp. 926-929, May/Jun. 2005.

Yoshida et al., "Surface Potential Control of an Insulator Layer for the High Performance Organic FET," *Synthetic Metals*, vol. 137, pp. 967-968, 2003.

Singh et al., "High-mobility n-channel organic field-effect transistors based on epitaxially grown c60 films," *Organic Electronics*, vol. 6, pp. 105-110, 2005.

Kamata et al., "Low voltage operation of the organic thin film transistor with a diagonal configuration," *Proceedings of the SPIE*, vol. 5217, No. 1, pp. 133-140, 2003.

\* cited by examiner

TRANSISTOR STRUCTURES AND METHODS OF FABRICATION THEREOF

FIELD OF THE INVENTION

The present invention is generally in the field of designing electronic device architectures. More specifically the invention relates to thin film transistors for use, for example, in organic electronics, display devices and detectors.

REFERENCES

The following references are considered to be pertinent for the purpose of understanding the background of the present invention:
1. H. Siringhaus, N. Tessler, and R. H. Friend, Science 280, 1741-1743 (1998);
2. N. Stutzmann et al., "Self-aligned, vertical-channel, polymer field-effect transistors" Science 299, 1881-1884 (2003);
3. S. Tanaka et al "Vertical- and lateral-type organic FET using pentacene evaporated films," *Electrical Engineering in Japan*, vol. 149, pp. 43-48, 2004;
4. J. I. Nishizawa, T. Terasaki, and J. Shibata, "Field-Effect Transistor Versus Analog Transistor (Static Induction Transistor)," *Ieee Transactions on Electron Devices*, vol. ED22, pp. 185-197, 1975;
5. L. Ma and Y, Yang, "Unique architecture and concept for high-performance organic transistors", *Applied Physics Letters* 85, 5084-5086 (2004);
6. V. K. Smirnov et al., "Technology for nanoperiodic doping of a metal-oxide-semiconductor field-effect transistor channel using a self-forming wave-ordered structure," *Nanotechnology*, vol. 14, pp. 709-715, 2003;
7. X.-Z. Bo et al., "Pentacene-carbon nanotubes: Semiconducting assemblies for thin-film transistor applications," *Appl. Phys. Lett.*, vol. 87, pp. 203510, 2005;
8. B. D. Gates, Q. B. Xu, J. C. Love, D. B. Wolfe, and G. M. Whitesides, "Unconventional nanofabrication," *Annual Review of Materials Research* 34, 339-372 (2004);
9. W. A. Lopes and H. M. Jaeger, "Hierarchical self-assembly of metal nanostructures on diblock copolymer scaffolds", *Nature* 414, 735-738 (2001);
10. M. P. Stoykovich et al., "Directed assembly of block copolymer blends into nonregular device-oriented structures", *Science* 308, 1442-1446 (2005);
11. D. S. Park et al., "Characteristics of perylene-based organic thin-film transistor with octadecyltrichlorosilane", *Journal of Vacuum Science & Technology B* 23, 926-929 (2005);
12. M. Yoshida et al., "Surface potential control of an insulator layer for the high performance organic FET" *Synthetic Metals* 137, 967-968 (2003);
13. T. B. Singh et al., "High-mobility n-channel organic field-effect transistors based on epitaxially grown $C_{60}$ films", *Organic Electronics* 6, 105-110 (2005);

BACKGROUND OF THE INVENTION

Thin Film Transistors (TFTs) relate to field effect transistors (FETs), in is which an electric field created by the gate controls the flow of current along the transistor channel from the source to the drain. TFTs, including organic thin film transistors and those based on the use of amorphous silicon (a-Si), are being developed for a variety of applications among which are back-plane for non-emissive displays (such as liquid crystal display, electronic ink), emissive displays (such as Organic Light-Emitting Diode (OLED) display), and logic circuits.

The largest obstacle in the road to full realization of the potential is the low charge mobility restricting the flow of carriers across the channel which limits the current such a transistor can provide. For example, a transistor that is much larger than the LED was used in order to supply enough current density to turn the LED emission on [1]. In the logic area, it limits the switching speed (charging gate capacitance takes too long) and enhances the sensitivity to background noise.

High brightness and efficient organic-LED based screens are being developed by industry giants such as Samsung, Philips, Sony, Kodak, and Dupont. Recently, high-quality organic displays made on glass substrates have begun to penetrate the market, and larger screens are expected to appear in the near future. The exciting potential of organic LEDs originates from their flexibility. Companies around the globe are seeking to develop a flexible backplane transistor array that will enable a flexible emissive display. So far, the limited charge-carrier mobility of organic materials (less than 1 $cm^2v^{-1}s^{-1}$) is not sufficient to provide the necessary current to the emitting diode.

The performance of organic TFTs are at best comparable to those based on amorphous silicon, and is still poor compared to inorganic crystalline material based devices. Most efforts are still focused on the traditional lateral TFT structure. These approaches include those aimed at reducing the contacts resistance or the trapping states of the insulator-channel interface; increasing the dielectric constant of the gate dielectrics or reducing the channel length using sophisticated lithography.

In the margins of organic TFT (OTFT) research, two main approaches have been introduced so far:

The first approach is based on the creation of a vertically stacked transistor so that a distance between its electrodes (i.e. channel length) is defined by the thickness of an organic layer that can be as low as 100 nm (compared to several microns in planar architecture) using solution processing technology. Apart from the fabrication price reduction, these devices should have enhanced DC performance and better switching speed.

A gate-source-drain vertical organic field effect transistor (VOFET) structure has been developed [5], in which the gate electrode is placed below the source electrode, and is separated from the active region by an insulating (dielectric) layer. This is illustrated in FIGS. 1a-b showing (a) the VOFET structure and schematics of the common source electrode roughness, and (b) the atomic force microscope image of the source electrode surface. This approach relies on making a thin yet generally conducting metallic electrode. The authors define this structure as an active cell on top of a capacitor cell. This transistor utilizes, for the source electrode, a highly non uniform film in that it has thin and thick regions. FIG. 1c shows the VOFET conductance characteristics for different gate-source voltage. The impressive performance of this device includes 10 mA channel current at the drain-source potential $V_{DS}$ of 4V and the gate-source potential $V_{GS}$ of 5V with an ON/OFF ratio close to $4\times10^6$. However, is transistor design suffers from the need to produce the source electrode with a finely tuned roughness (i.e., optimization of thin versus thick properties of the film), which lowers reproducibility of these results.

The second approach is based on a standard lateral configuration, but where the channel length is effectively shortened. This can be achieved by including highly conductive regions in the channel. Shortening the effective length that the charge needs to pass through in the semiconductor reduces the overall channel resistance and results in a higher current.

A self-forming one dimensional nanostructure has been developed, being designed as a wave-ordered structure with a controllable period (20-180 nm), which resulted from the off-normal bombardment of amorphous silicon layers by low-energy (about 1-10 keV) nitrogen ions [6]. According to his technique, the nanostructure has been modified by reactive-ion etching in plasma to form a periodic nano-mask on the surface of the channel region of a metal-oxide-semiconductor field effect transistor (MOSFET). Implantation of arsenic ions through the nano-mask followed by the technological steps completing the fabrication of the MOSFET resulted in a periodically doped channel field-effect transistor (PDCFET), which can be considered as a chain of short-channel MOSFETs with a common gate or an effectively single FET with a shorter channel. This is illustrated in FIG. 2a showing schematic description of a nano-periodic doping profile of the channel region.

Some other techniques of the planar-architecture field utilize creation of a sub-percolation network of conducting carbon-nanotubes between the contacts of the planar structure so as to reduce the effective distance between the contacts [7]. More specifically, conductive carbon nanotubes were employed as a filler, and were spun onto the channel region with the aim of filling it to the point where it is just below percolation threshold. This is illustrated in FIG. 2b, showing schematic description of a channel filled with conductive carbon nanotubes to below percolation threshold. This approach is restricted by the requirement to avoid a short circuit through the conductive nanotubes, which dictates using a relatively low density of tubes. This requirement, in turn, leads to a very limited effect.

Amorphous silicon based TFTs also typically suffer from slow switching speeds and low current handling capacity, because the electronic properties of amorphous silicon fall short of single or poly crystalline silicon. The known solutions for this problem include enhancement of the electronic properties of the material, e.g. replacing amorphous silicon with polysilicon; reduction of feature size to reduce the transistor gate length; and the use of alternative transistor architectures. All these solutions require significant research and changes to existing production lines.

SUMMARY OF THE INVENTION

There is a need in the art for transistor structures having significantly enhanced performance (higher currents and shorter switching times) as compared to traditional transistors. Said enhanced transistors should preferably be based on the same materials and fabrication technology as state-of-the-art transistors.

The present invention, in its one aspect, solves the above problem by providing a novel electronic device (particularly a transistor structure) having a patterned electrically conductive layer, associated with either one of the active elements of the electronic device, namely source, drain or channel in case of a transistor device. The pattern is such as to form discontinuity of electrical conductivity along said layer. More specifically, the pattern (in some embodiments, nanoscale pattern) is in the form of an array (preferably two-dimensional array) of spaced-apart electrically conductive regions (e.g. islands) spaced by regions of relatively low conductivity (e.g. dielectric, or semiconducting regions). This technique provides for reducing the "effective length" of the transistor channel without any doping of the channel material.

According to another aspect, the invention solves the above problem of reducing the effective length of the transistor channel, by patterning the channel region of the transistor using selective doping. This selective doping of the channel region provides a two-dimensional pattern of the doped regions in the channel, resulting in at least 90% fill factor of doped regions in the channel. The channel is made of one of the known suitable materials (Si, a-Si, polymer, small molecule) with the dopant atom or molecule selected from the variety known in the art (for example, P and Al are known dopant for Si, or sulfonate for thiophene based materials).

According to some embodiments of the invention, the patterned electrically conductive layer is the source or drain electrode, to create discontinuity of electrical conductivity along said electrode. This is particularly useful in a vertical configuration transistor structure.

According to some other embodiments of the invention, relating to lateral configuration transistor structures, the patterned electrically conductive layer is associated with a transistor channel. This is achieved by placing such a patterned layer, in the form of an array of spaced apart electrically conductive regions (e.g. islands), above or below the channel layer. The patterning can be achieved through the use of appropriate organic materials preferably block copolymers) due to their varying affinity to metal atoms and/or conducting polymers. Some other methods include various printing, soft lithography techniques [8], or standard lithography (as used in a-Si processes).

According to yet other embodiments, the two dimensional array of islands may be created by an additive process that induces spatial selective doping in the channel material.

Considering the vertical transistor design, the electrode (source or drain) is a grid-like structure (network of metal stripes); and in the planar transistor design, the channel region between source and drain is a pattern (preferably two dimensional pattern) of high density (high filling factor) of conducting regions which create a possibly non-uniform or irregular pattern on the scale of the conducting region but uniform on the channel length scale.

The invention is particularly useful in the field of organic electronics and specifically thin film transistors (TFTs) and detectors. For example, The invention can advantageously be used for fabrication of plastic electronic devices with an effective charge mobility that is much higher than can be achieved with organic materials.

Thus, according to one broad aspect of the present invention, there is provided an electronic device comprising a patterned electrically-conductive layer associated with an active element of the electronic device, said electrically-conductive layer has a pattern defining an array of spaced-apart electrically conductive regions, thereby increasing an electric current through the device.

More specifically, the present invention relates to a thin film transistor device and is therefore described below with respect to this specific application. In such a transistor, a channel may comprise a semiconductor material, a polymer material, a polysilicon, or amorphous silicon. The invention provides various designs of the electrically conductive pattern in the thin film transistor, some being more suitable to polymer-based TFT, and some to a-Si based TFT.

In some embodiments of the invention, a lateral-configuration TFT is considered (source and drain electrodes being arranged in a spaced-apart relationship in the same layer). In these embodiments, the patterned electrically-conductive layer is associated with the transistor channel between the source and drain electrodes.

In some examples of these embodiments, the electrically conductive layer may be in the form of the array of islands or in the form of elongated region of the electrically conductive material arranged in spaced-apart relationship in a region along the channel element, above or below the channel layer.

The array of electrically conductive regions is preferably a two-dimensional array.

The array of the electrically conductive regions may extend along at least one axis inclined with respect to the channel axis.

In some embodiments of the invention, an appropriate organic material preferably block copolymer) of varying affinity to said electrically conductive material is used as a substrate for said patterned electrically conductive layer and as a template for said pattern therein. Preferably, a block copolymer is PS-b-PMMA. Generally, at least one of the following block copolymers can be used: polystyrene-block-poly(methyl methacrylate) (PS-PMMA), polystyrene-block-poly(ethylene oxide) (PS-PEO), polystyrene-block-poly(4-vinyl pyridine) (PS-P4VP), PS-P2VP, and polystyrene-block-poly(ferrocenyldimethylsilane) (PS-PFES). In some other embodiments, the organic material composition comprises at least two different organic materials which may phase separately. These may be polystyrene, poly(methyl methacrylate), and any combination of each with other polymers. In yet other embodiments, the organic material is one capable of forming a monolayer on the surface of the channel layer. Generally, such organic materials may be one or more of the following exemplary materials: octadecyltrichlorosilane [$CH_3$—$(CH_2)_{17}$—$SiCl_3$, (OTS)], 1H,1H,2H,2H-perfluorododecyltrichlorosilane [$CF_3$—$(CF_2)_{12}$—$CH_2$—$CH_2$—$SiCl_3$, (PF)], 10-undecenyl trichlorosilane [$CH_2$=$CH$—$(CH_2)_9$—$SiCl_3$, (10 un), methoxy ethoxyundecyl trichlorosilane [$CH_3$—O—$(CH_2)_2$—O—$(CH_2)_{11}$—$SiCl_3$, (MET)], 11-acetoxyundecyl trichlorosilane [$CH_3$—(CO)—O—$(CH_2)_{11}$—$SiCl_3$, (AC)]. This monolayer may be patterned to create the affinity pattern. The patterning can be achieved through various methods including printing, embossing or any other soft lithography techniques [8].

The configuration of the lateral TFT may be such that it includes a gate electrode, a channel element with its associated patterned electrically conductive layer located above the gate and electrically insulated therefrom, and a layer containing the source and drain electrodes located above the channel and having electrical contact thereto. The source and drain containing layer may be said patterned electrically conductive layer and comprising the electrically conductive region serving as a second floating gate electrode located between and electrically insulated from the source and drain electrodes and from said channel layer. Alternatively, the source and drain electrodes may be configured with extended regions thereof extending above corresponding regions of the channel layer and electrically insulated therefrom.

The TFT configuration may be such that it includes a gate electrode covered by an electrical insulator, the amorphous silicon channel layer on top of said electrical insulator, and a layer containing the source and drain electrodes above the channel with regions of n+ amorphous silicon in between the channel and the source and drain electrodes. The layer containing the source and drain electrodes serves as said patterned electrically conductive layer defining the array of spaced-apart electrically conductive regions within a region above the channel in between the source and drain electrodes. In this embodiment, the configuration may be such that each of the spaced-apart electrically conductive regions is in the is form of a stack of n+ amorphous silicon and metal on top thereof; or in the form n+ amorphous silicon layer only; or metal layer only.

In yet another example, the TFT includes a gate electrode covered by an electrical insulator, the array of spaced-apart electrically conductive regions of said patterned electrically conductive layer on top of said electrical insulator, the amorphous silicon channel layer on top of said patterned electrically conductive layer, and source and drain electrodes above the channel with regions of n+ amorphous silicon in between the channel and the source and drain electrodes. In this case, the patterned electrically conductive layer may be made of n+ amorphous silicon.

In yet a fierier example of lateral TFT, it includes a gate electrode covered by a first electrical insulator, the amorphous silicon channel layer on top of said electrical insulator, a second electrical insulator layer on top of said channel layer, and a layer containing the source and drain electrodes above said second insulator such that the source and drain electrode have electrical contact to the channel. The layer containing the source and drain electrodes is said patterned electrically conductive layer defining the array of spaced-apart electrically conductive regions within a region above the channel in between the source and drain electrodes.

In some other embodiments of the invention, it provides a novel architecture for a vertical thin film transistor (TFT), i.e. where source and drain electrodes are arranged in different layers. In these embodiments, the patterned electrically conductive layer is at least one of the source or drain electrode, the so-called patterned source vertical TFT (PS-VTFT) or patterned drain vertical TFT (PD-VTFT). Such a TFT is effectively very different from the known structures of the kind specified. In the vertical transistor of the invention (gate electrode/dielectric/source electrode/active layer/drain electrode), either the source or drain electrode is patterned to be a grid-like conductive layer, namely to include holes (or gaps) surrounded by narrow metal lines (which need not be thin). The holes have preferably a characteristic diameter comparable to the semiconductor thickness. The transistor structure may be a Si-based structure with Ag-electrodes. In these embodiments, a suitable organic material preferably block copolymer) may be used as an insulator material and as template for the patterned source or drain electrode.

The vertical transistor structure may be configured to define a gate electrode; a gate dielectric structure on top of the gate electrode, a patterned layer of the source electrode on top of the gate dielectric structure and carrying a semiconductor channel element; and the top drain electrode. The gate dielectric structure includes the dielectric and the block polymer thin film.

In another example, a vertical TFT includes a gate electrode, a gate dielectric structure on top of the gate electrode, a patterned layer of the drain electrode on top of the gate dielectric structure and carrying a semiconductor channel element, and the top source electrode. The gate dielectric structure includes the dielectric and the block polymer thin film.

The patterned source electrode may be porous metal layer produced by nanoscale patterning of surface energy. In some other embodiments, the patterned electrode is configured as a network of metal stripes. The pattern is preferably in the form of the two-dimensional array of the electrically conductive regions.

According to another broad aspect of the invention, there is provided a lateral configuration thin film transistor device comprising a channel element between source and drain electrodes, said channel element having a pattern in the form of a two-dimensional array of spaced-apart regions of a material of higher electrical conductivity spaced by regions of lower electrical conductivity.

The channel element may comprise a layer of the first, lower electrical conductivity material selectively doped with a second material of the higher electrical conductivity within said spaced-apart regions arranged in the two-dimensional array.

The channel element may comprise a first continuous layer of the lower electrical conductivity material, and a second layer located close to said first layer and being patterned to define said two dimensional array of the regions of the higher electrical conductivity material. The second patterned layer may be located between the first layer and the source and drain containing layer. An insulating layer may be provided between the first layer and the patterned second layer. Alternatively, the second patterned layer is located below the first layer, on top of a gate insulator layer.

According to yet another broad aspect of the invention, there is provided a method for use in manufacturing a vertical thin film transistor structure, the method comprising applying patterning to at least one of source and drain electrode layers to create discontinuity of electrical conductivity along said electrode, to thereby enhance the conductivity of subsequent layers in the transistor structure.

In the case of vertical TFTs, the invention provides an essentially different solution for allowing the gate voltage to affect the device current. According to the invention, a grid-like electrode (e.g. source electrode) is used, which allows the gate field flux to penetrate the source electrode layer at regions that are not covered by metal (i.e. non-conductive regions within the source electrode layer) and draw charges out of the grid to facilitate the current flow. This unique electrode structure makes the physical process driving the switch-on very different to that of [5], and facilitates a much more robust and reliable production.

The vertical transistor structure of the invention creates the field flux that attracts charge carriers from the source metal to the exposed regions at the semiconductor-insulator interface in a manner very similar to that of filling the channel in a lateral OFET. In this respect, a layer structure, defining gate electrode, dielectric, grid electrode, and semiconductor, functions in a very similar fashion to a lateral bottom-contact FET, where both source and drain electrodes are kept at equal potential and the gate is used to form a conductive channel (carrier reservoir) in the region between the electrodes. The top electrode of the current design balances the potential in the semiconductor so that part of the charges that are drawn by the gate will consequently flow to the drain and produce the device current. The source electrode metal is chosen such that there is a barrier to charge injection into the semiconductor so that the drain electrode can not draw current directly from the source electrode.

A very similar structure, but with preferably larger holes, would use the gate field to draw charges from the top electrode to fill the region (carrier reservoir) between the grid lines. This filling is similar to channel formation in a top contact FET configuration. In his structure, the top electrode acts as a source and the patterned (grid) electrode acts as a drain. Again, the source electrode metal is chosen such that there is a barrier to charge injection into the semiconductor so that the drain electrode can not draw current directly from the source.

According to yet another aspect of the invention, it provides a lateral thin film transistor structure, in which a transistor channel element comprises a first channel layer of a lower electrical conductivity and a second layer below or above the channel layer and in the form of an array of spaced-apart regions of higher electrical conductivity.

The invention provides for various novel applications of the nanoscale patterns of surface energy. According to the invention, the nanoscale patterns of surface energy are used to enhance the electronic conductivity of subsequent layers. It should be understood that the term "surface energy" is referred to herein as forces that are mediated by mechanisms such as hydrophobic/hydrophilic, electrostatic, etc.

The nanoscale patterns of surface energy can be used to create non-uniform film of solution processed semiconducting, conducting or metallic materials in a controllable manner. This effect can be further used to provide a non-uniform or "rough" solution processed electrode that is required for vertical-type field effect transistors.

The nanoscale patterns of surface energy can be used to affect the packing and film forming of semiconducting molecules such that their mobility is enhanced (better molecular packing and less uncontrolled grain boundaries).

The nanoscale patterns of surface energy can be used to create non-continuous films of solution processed semiconducting, conducting or metallic materials with a very high surface coverage (yet non-continuous to prevent electrical short). The latter can be used to effectively reduce the distance between two metallic electrodes, e.g. reduction of the effective channel length in a field-effect transistor (FET), as well as to non-uniformly dope subsequent layers. These effects can be further used to enhance the effect of non-ideal contacts to TFTs. For example, highly efficient detectors can be created by enhancing the effect of light-sensitive charge injection.

The invention provides for using block copolymers to create the surface energy modification required to achieve any one of the above-indicated effects.

The invention is useful in the field of sub-percolation conductive networks. It has been proposed to use metallic nanotubes to create such networks. This known method, however, utilizes percolation as the driving mechanism. To achieve best performance, the network is to be brought very close to its threshold but to be kept below it so as to avoid an electrical short. Below percolation threshold, a short distance may be obtained only on a very limited area, where in the rest of the device the distance is considerably larger and the overall effect is small.

The inventors have found that using block-copolymers provides for creating conducting patterns that are predetermined and have very small gaps across the entire device so that the effective gap is indeed very small. According to the invention, conducting polymers (instead of metal) in conjunction with the block copolymers are used. The pattern provided by the block copolymer can be mimicked by other, generally more sophisticated, lithography or printing/embossing methods.

The invention also provides for a novel a-Si based TFT enabling the use of conventional Si-based technology.

The invention also provides a method to reduce operational degradation of disordered (as a-Si) FETs by placing a charge rich region (as in n+ doped a-Si) in close vicinity of the channel such that electronic states that occur during operation are passivated by this charge reservoir. In one aspect the charge rich region can be a multitude of regions (islands) distributed along said channel. In another aspect of the invention at least one of these regions is not directly connected to the source or drain electrodes.

BRIEF DESCRIPTION OF THE DRAWINGS

In order to understand the invention and to see how it may be carried out in practice, a preferred embodiment will now be described, by way of non-limiting examples only, with reference to the accompanying drawings, in which:

FIG. 3A shows the top view of a source or drain electrode designed according to the invention, FIG. 3B shows the side view of a patterned source vertical TFT (PS-VTFT) utilizing this electrode, and FIG. 3C shows the side view of a patterned drain vertical TFT (PD-VTFT) of the invention;

FIG. 6A shows a network of conductive nanoscale metal wires that reflect the underlying block copolymer in film, and FIG. 6B shows a network that was obtained by evaporating a smaller amount of metal onto the polymer film, resulting in isolated islands that, nevertheless, mimic the block copolymer pattern;

DETAILED DESCRIPTION OF EXEMPLARY EMBODIMENTS

Figure 1A:
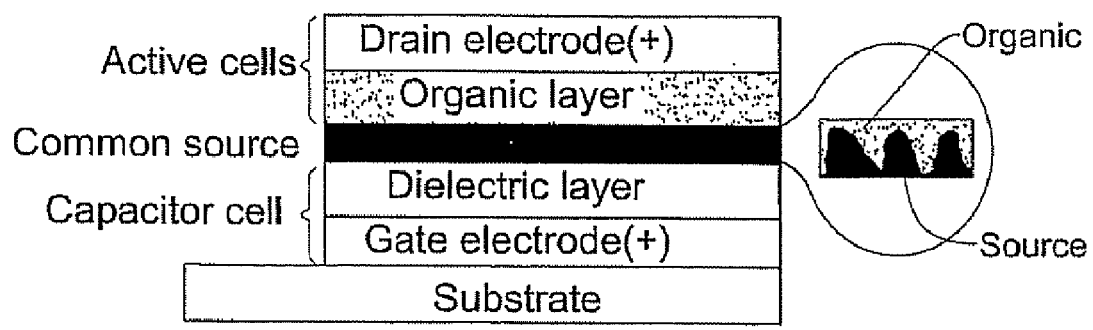
FIGS. 1A-B show the known gate-source-drain vertical organic field effect transistor (VOFET) structure described in [5]
Figure 1B:
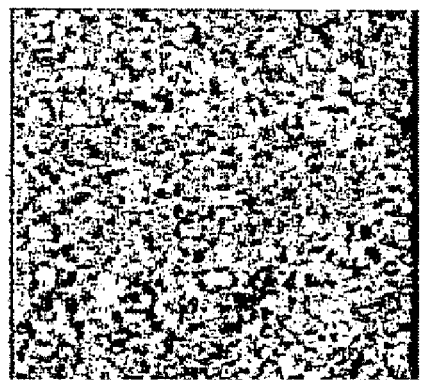
Figure 1C:
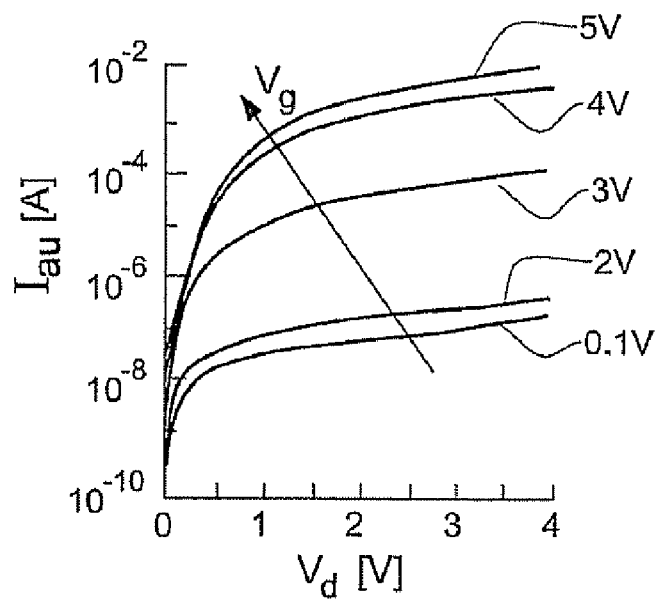
FIG. 1C shows the VOFET conductance characteristics of the transistor structure of FIGS. 1a-b for different gate-source voltages.

FIGS. 1a-b show the known gate-source-drain vertical organic field effect transistor (VOFET) structure described in the above-indicated article of L. Ma and Y. Yang, "Unique architecture and concept for high-performance organic transistors", *Applied Physics Letters* 85, 5084-5086 (2004)]. FIG. 1c shows the VOFET conductance characteristics for different gate-source voltage.

Figure 2A:
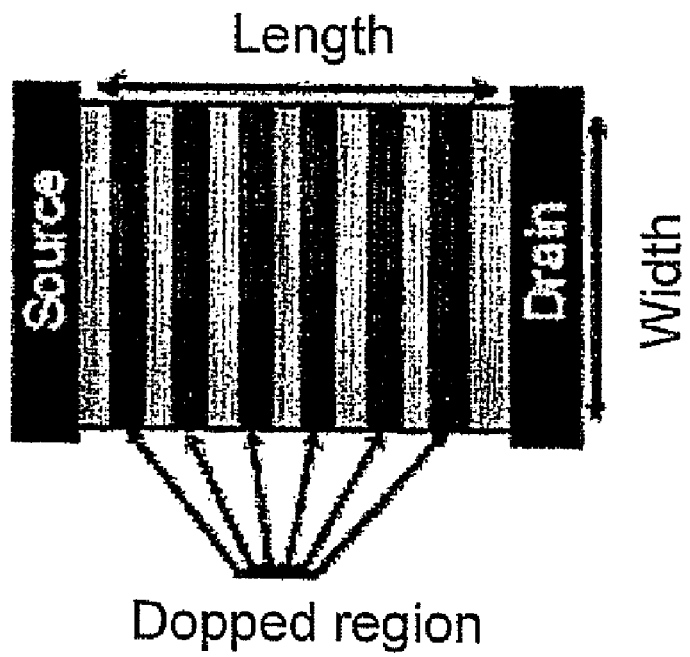
FIGS. 2A and 2B illustrate the known planar transistors described in [6] and [7] respectively.
Figure 2B:
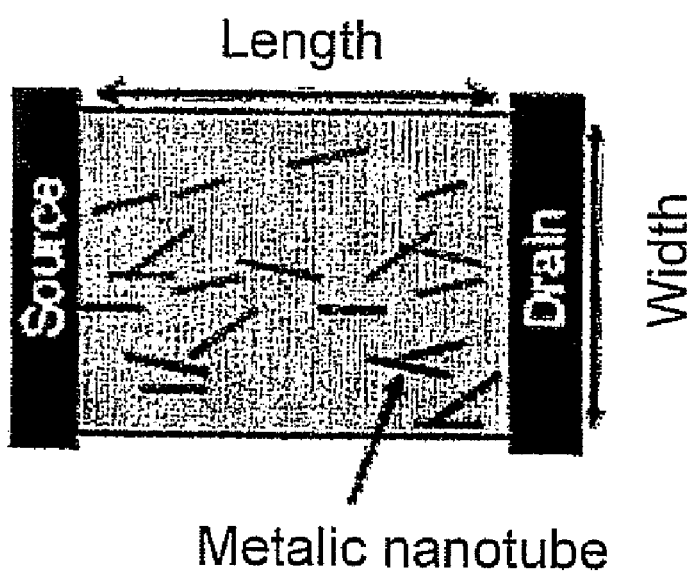

FIGS. 2a and 2b illustrate the known planar transistors described in [6, 7].

The present invention, according to its one aspect, provides a novel transistor structure having a patterned electrically-conductive layer associated with an active element of the transistor. This electrically-conductive layer has a two-dimensional pattern defining spaced-apart electrically conductive regions. This allows for increasing an electric current through the transistor, as well as a switching speed thereof.

The invention can be used in vertical configuration transistors and in lateral configuration transistors. The following are some examples of the implementation of the invention in vertical TFTs.

In vertical transistor structures, the channel length is dictated by the thickness of the channel layer (e.g. polysilicon, or amorphous silicon, or polymer layer) and not by the horizontal distance between the drain and source electrodes. In such devices, a gate electrode may be placed below the source and drain electrodes. The main obstacles in this arrangement arise from the source electrode shielding the gate electric field from penetrating into the channel. The invention solves this problem by using a source or drain electrode as an electrically-conductive layer having a pattern in the form of spaced-apart electrically conductive regions, e.g. a perforated electrode. This solution enables the gate electric field to penetrate through the perforated source/drain electrode, enabling its flux to control the injection current from the source electrode into the channel material.

Figure 3A:
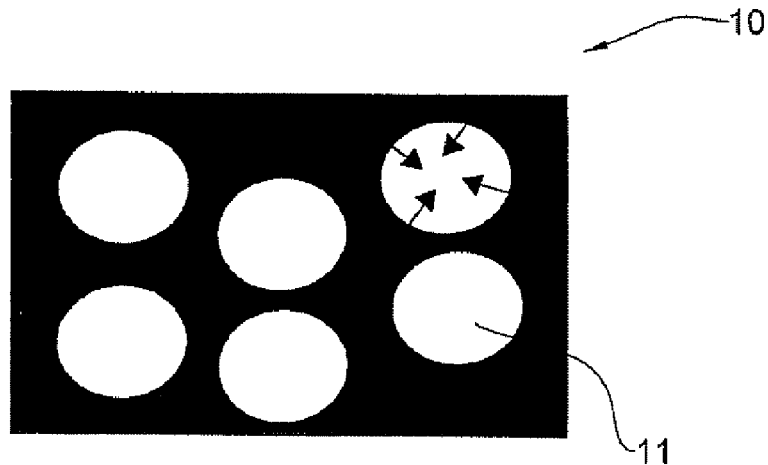
FIGS. 3A to 3C exemplify the present invention utilized in a vertical transistor design.
Figure 3B:
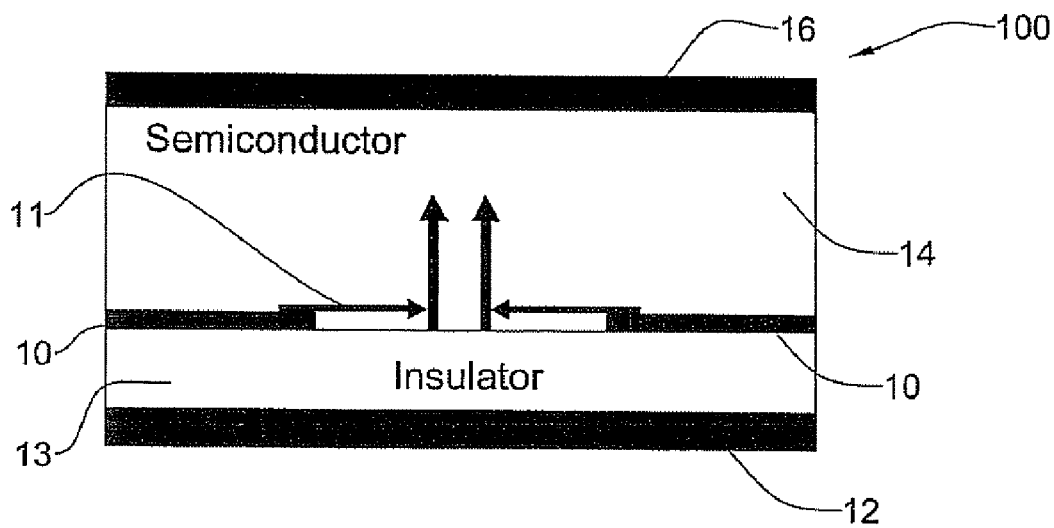
Figure 3C:
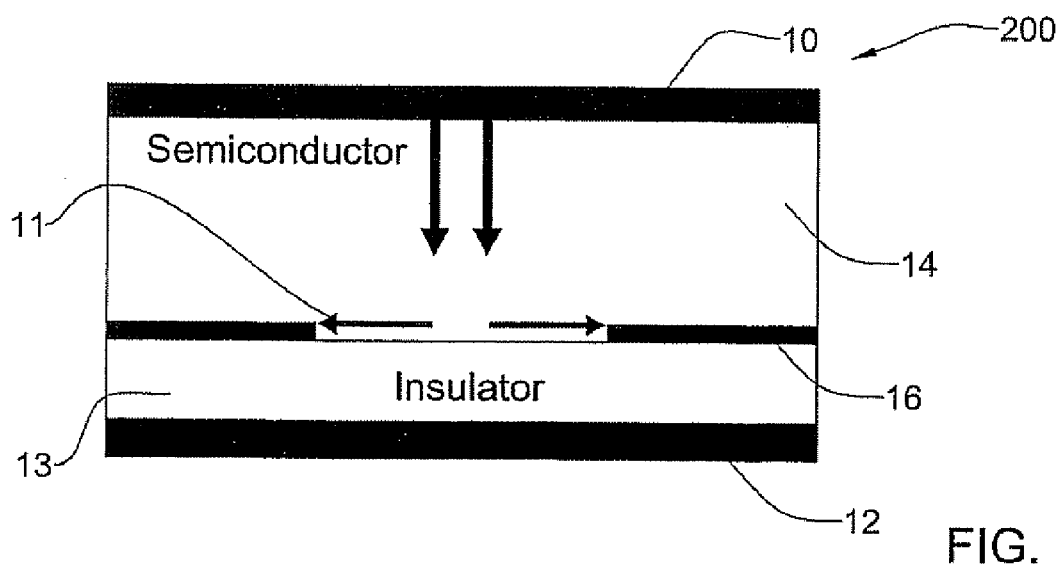

Reference is made to FIGS. 3A-3C showing schematically an example of the present invention utilized in a vertical transistor design. FIG. 3A shows the top view of an electrode 10 presenting said patterned electrically conductive layer. The electrode 10 is patterned, i.e. formed with holes (perforations) 11, to present a grid-like structure. Such a pattern made in an electrically conductive (metal) layer actually presents a non-continuous electrical conductivity along the layer.

FIG. 3B shows the side view of a TFT 100 utilizing this electrode 10 as a source electrode (the so-called "PS-VTFT"). The TFT 100 includes a gate electrode 12 spaced from the source electrode layer 10 by an insulator 13; a channel element layer 14 (semiconductor layer in the present example); and a drain electrode layer 16.

The source 10 metal is chosen such that is has a barrier for charge injection into the semiconductor layer 14 above it so that direct injection from the source metal towards the drain electrode 16 is suppressed. The metal is one of the known metals (aluminum, copper, silver, gold, etc.) and is chosen such that its work-function is distanced from the semiconductor level (or band) such that an injection barrier is formed. To allow for injection, the channel 14 is first to be filled (i.e. the gap region) by charge carriers with the aid of the gate voltage. Once charges are present in the semiconductor material 14, they will freely move to the collecting drain electrode 16 and the transistor 100 will be in the ON state. A zero (or reverse) bias relative to the source electrode 10 will empty these regions and thus the transistor will be in the OFF state.

FIG. 3C shows a similar vertical TFT structure 200. To facilitate understanding, the same reference numbers are used for identifying components that are common in all examples of the invention. In the transistor 200, said electrically conductive patterned layer is constituted by a drain electrode 16. Here, the gate field is used to draw charges from the top electrode 10 that now functions as a source.

The patterned electrically conductive layer may be formed using a conventional lithography. This is more suitable technique in case of polysilicon or amorphous silicon channel material. Alternatively, the patterning may be based on selective metal deposition onto the insulator layer 13, in which case the insulator layer 13 has an organic material of a varying affinity towards the deposited metal (e.g. a block copolymer such as PS-b-PMMA). This technique is preferred in case of a polymer-material channel.

Figure 4A:
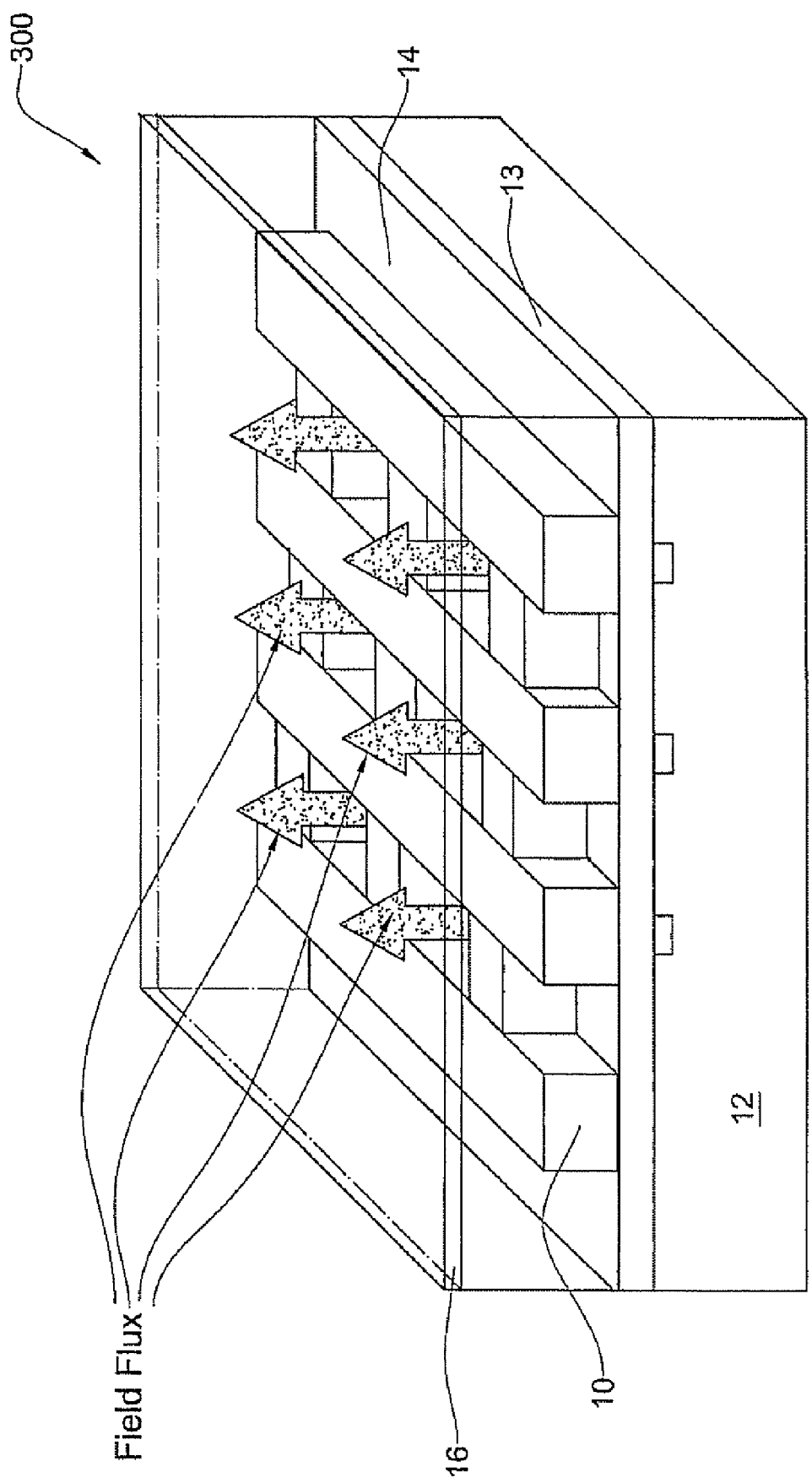
FIGS. 4A-4F exemplify the configuration and operation of a patterned source vertical TFT (PS-VTFT) of the invention.

Reference is made to FIGS. 4A-4F exemplifying the configuration and operation of an inventive patterned source vertical TFT (PS-VTFT) 300. As shown in FIG. 4A, the PS-VTFT 300 includes a layer stack defining a gate electrode layer 12, an insulator layer 13, a source grid layer 10 (constituting said patterned electrically conductive layer), a channel element (semiconductor) layer 14, and a drain electrode layer 16. The grid-like source electrode 10 allows the gate field flux to penetrate the source electrode layer at spaces in between the electrically conductive regions of the source electrode. The field flux attracts charge carriers from the source metal to the exposed regions at the semiconductor-insulator interface in a manner very similar to that of filling the channel in a lateral OFET. Due to the fact that the source electrode metal is chosen such that there is a barrier to charge injection into the semiconductor, adjusting the gate electrode voltage provides the required electric field to lower this injection barrier.

Figures 4B, 4C:
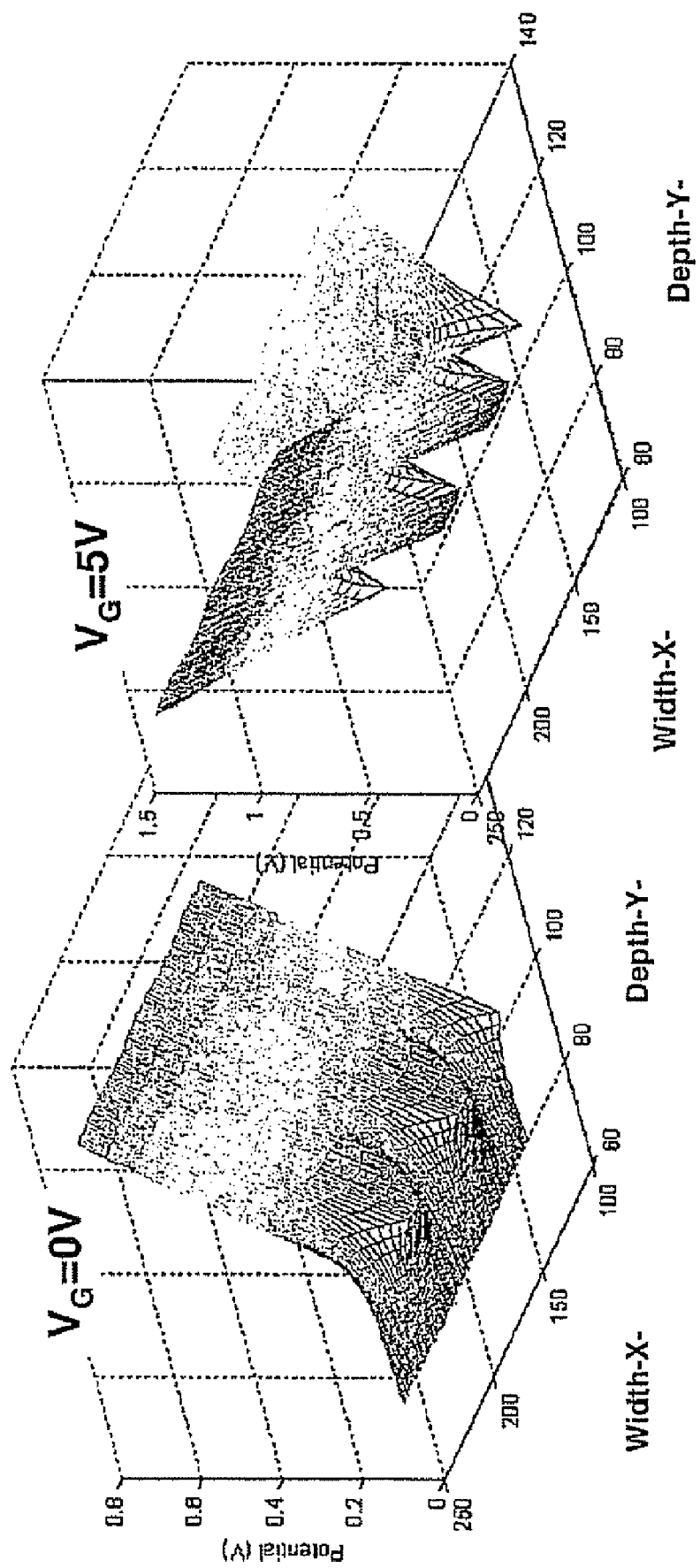

FIGS. 4B and 4C show the calculated potential distribution close to the source grid for PS-VTFT structure at the same drain-source voltage ($V_{DS}$=5V) and different gate-source voltages ($V_{GS}$=0V in FIG. 4A and $V_{GS}$=5V in FIG. 4B). It should be noted that the larger potential drop occurs close to the source grid interface for $V_{GS}$=5V.

This device was designed by solving the two-dimensional Poisson equation for the potential distribution between the gate-source-drain electrodes. The calculation was carried out assuming the source grid-electrode to be at $V_S$=0V, the drain (top) electrode at $V_D$=$V_{DS}$=5V, and the gate electrode either at $V_G$=$V_{GS}$=0V or at $V_G$=$V_{GS}$=5V. The calculation shows how the gate can influence the charge injection from the source grid-electrode into the semiconductor.

As indicated above, in this specific example, a block copolymer serves as an insulator material and as a template for the source or drain electrode. As shown more specifically in the example FIG. 4E, a transistor structure 400 is generally similar to the above-described structure 300, namely includes a gate electrode 12 (P-doped Si), a gate dielectric layer structure 13 ($SiO_2$ and the block copolymer (BCP) thin film), a patterned source layer 10 (Ag), a channel (semiconductor) layer 14 ($C_{60}$), and a top drain electrode 16 (Ag). In the transistor 400, the current injection from the patterned source 10 into the channel element 14 is optimized by inserting a thin non-conducting layer 15 between the channel 14 and the conducting pattern 10. The use of this inter-layer 15 in the vertical FET is associated with the following: An ohmic contact between the conducting pattern 10 and the semiconductor channel 14 is undesired, but rather a field-dependent contact is to be provided (to make sure the gate field can enhance the injection). This is achieved by using a tin insulator between the patterned source 10 and channel 14.

Figure 4D:
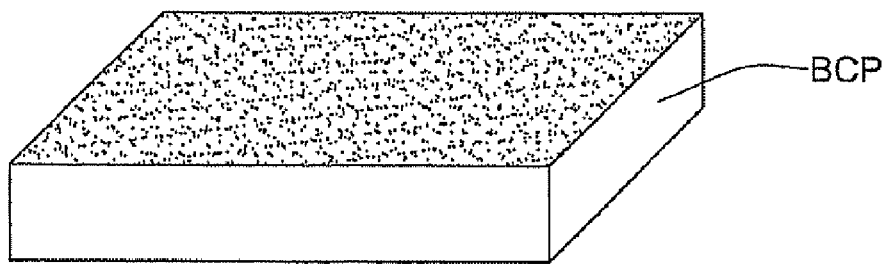

The thin and porous metal source electrode 10, shown more specifically in FIG. 4D, is located on top of the BCP template (top surface of layer 13). One of the target applications for this transistor is Active Matrix drivers for Organic LED based large area display (AM-OLED).

Methods suitable for producing such patterned electrode may be based on the technique described in [9] or in [9] appropriately optimized to enable controlling the morphology of the surface of the BCP film thus optimizing the layout of the metal layer and making its production highly reproducible. Optimization of the BCP surface pattern may involve using different BCP compositions, different relative block lengths (dictating BCP morphology), and controlling the substrate's surface properties. As indicated above, similar techniques can be used to create the gate electrode in other vertical transistor configurations, such as the static induction transistor (SIT) structure of [3].

Figure 4E:
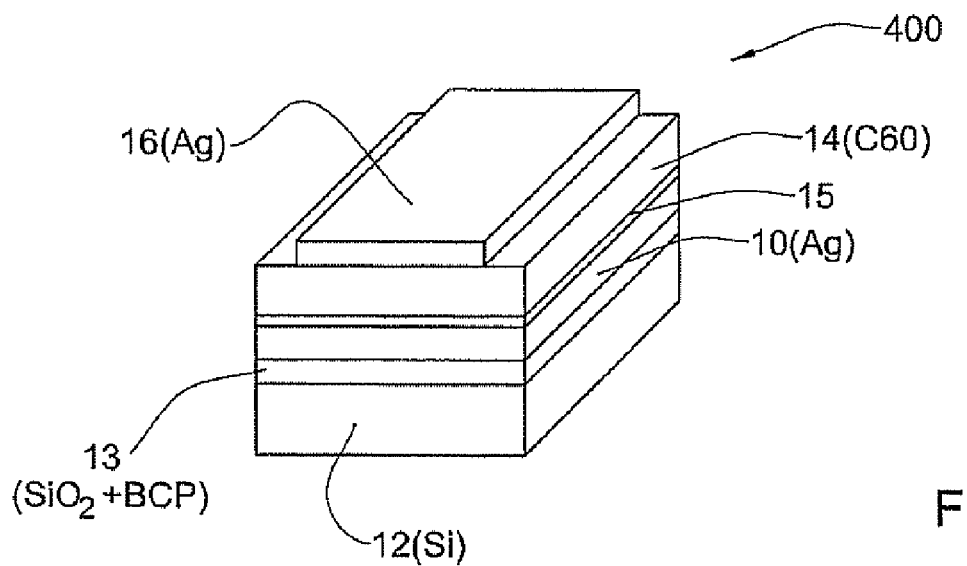
Figure 4F:
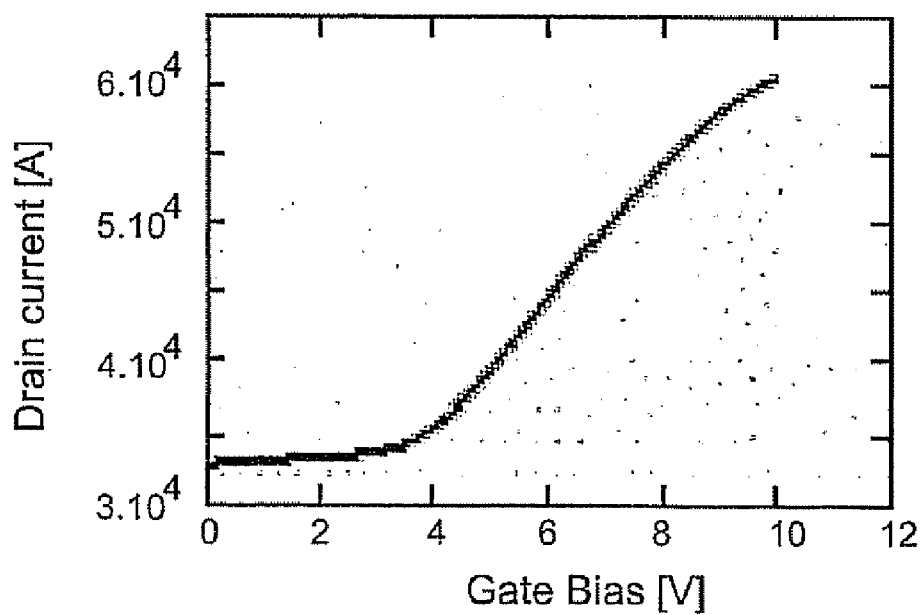

Using a BCP thin film as a template, the inventors have achieved a nanoscale Ag pattern with gaps (FIG. 4D) through which the electric field can penetrate. The openings in the silver pattern, which are dictated by the length of the PMMA blocks, are uniform in size and measure ca. 7 nm. As indicated above, the ability to control the morphology and chemical properties of the surface of the BCP film using different BCP compositions and block lengths provides for optimizing the layout of the metal layer and making its production highly reproducible. The inventors have achieved the metal lines formation (FIG. 4D) to make a vertically stacked TFT (FIG. 4E). FIG. 4F shows the output characteristics of this vertical TFT. It is shown that a gating effect can be achieved using the BCP technology.

The results of the two-dimensional Poisson solution have shown that the device performance can be improved using a different scale of BCPs. The device performance is determined by the effect of different block copolymer compositions and domain sizes on the resulted metal pattern and by the dependence between the metal layer structure (e.g., the morphology and dimensions of the gaps). The ON/OFF ratio of $10^6$ is available with a robust and reliable method of manufacturing.

The following is the description of the invented technology and its novel features compared to the known technique of the kind specified.

Figure 5:
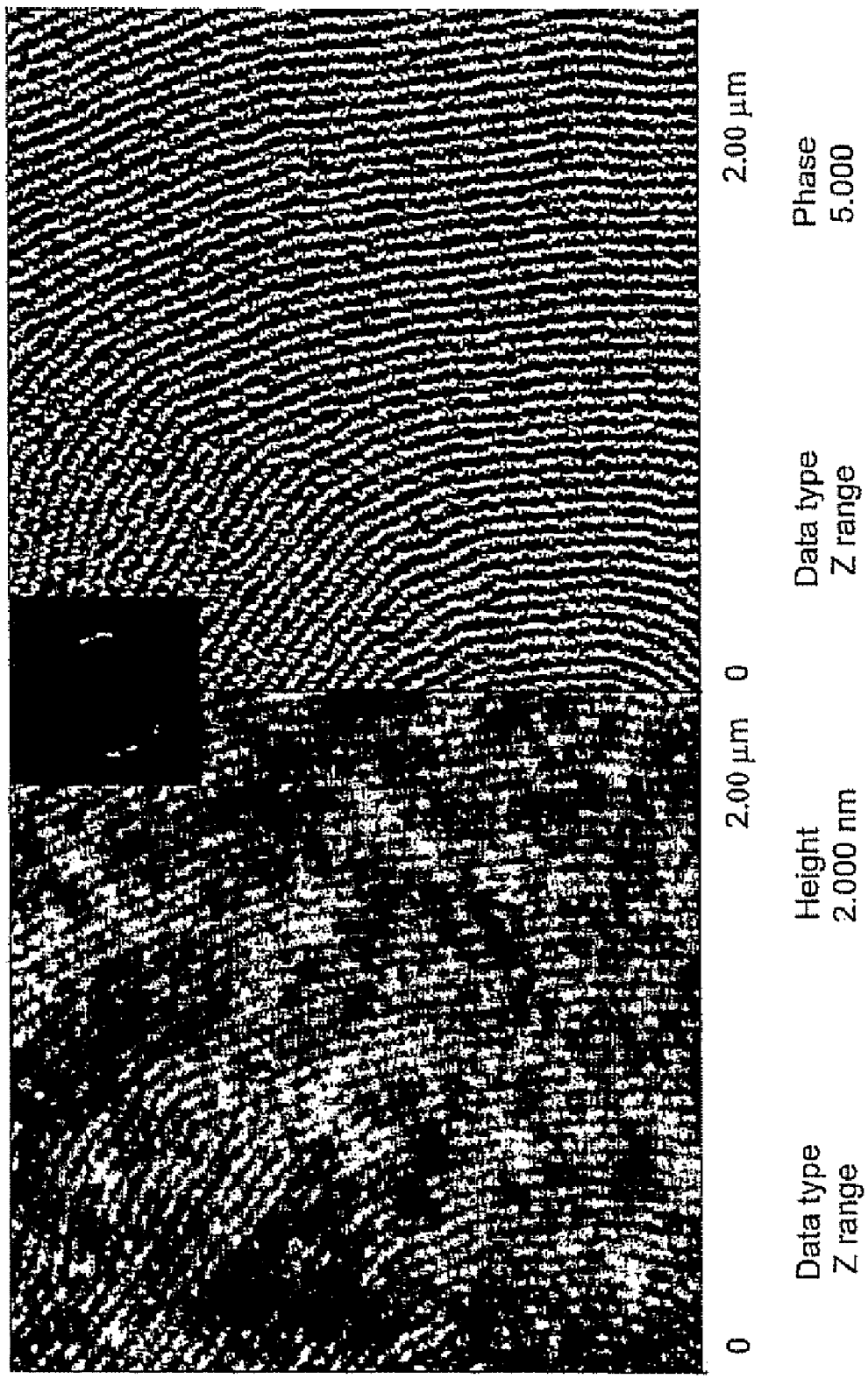
FIG. 5 shows a scanning probe micrograph image of PS-b-PMMA block copolymer template prepared by the known technique.

FIG. 5 illustrates an image of a polystyrene-block-poly (methyl methacrylate) (PS-b-PMMA) block copolymer template obtained by scanning probe micrograph. The left pane shows the height contrast and the right pane shows the phase (hardness) contrast between the PS (dark) and PMMA (light) domains; the inset shows the 2D Fourier Transform, which indicates a periodic structure. Such a block copolymer template can be prepared by one of the known techniques, for example consisting of the following:

A solution of cylinder-forming block copolymer (e.g., PS-b-PMMA with PMMA volume fraction of ca. 0.3) is spin-cast on a substrate (e.g., a silicon wafer with a top layer of silicon oxide) to form a thin film having a thickness that corresponds to one period of the block copolymer. Subsequent thermal annealing above the glass transition temperature of the polymer for a few hours results in microphase separation and the formation of segregated domains corresponding to the different blocks. The less bulky block forms cylinders in the matrix made of the other block. The top of the film presents a pattern of exposed half-cylinders with about 45 nm periodicity, which would serve as a template.

The present invention can utilize the above-described known technique to create surface energy patterned films, which in the examples of the invention also serves as an electronic insulator (gate dielectric in transistor). Various techniques can be used to direct the orientation of the cylinders and increase their ordering, including the use of electric fields, patterned surfaces, and spatial confinements. Such techniques are disclosed for example in [10].

It should be understood that the exemplified block copolymer may be replaced by an alternative block copolymers for patterned templates. Suitable block copolymers include, for example, the following: polystyrene-block-poly(methyl methacrylate) (PS-PMMA), polystyrene-block-poly(ethylene oxide) (PS-PEO), polystyrene-block-poly(4-vinyl pyridine) (PS-P4VP) (and also PS-P2VP), polystyrene-block-poly(ferrocenyldimethylsilane) (PS-PFES), and others.

PMMA provide a high degree of selectivity of evaporated metals (e.g., Ag, Au, and others; certain metals require a subsequent brief annealing step [9]) towards the polystyrene (PS) domains, which is a useful characteristic for the creation of patterned substrates. Additionally, PMMA is polar and provides good adhesion for PEDOT/PSS for the same purpose. The PMMA block can be replaced by any other polyacrylate or even by poly(acrylic acid) (PAA). PEO is water soluble, and thus enables the formation of PEDOT/PSS nanowires, which are required for the creation of vertical FETs. P4VP may be easily protonated on the pyridine unit and thus may provide enhanced adhesion of the PEDOT/PSS to its domains using electrostatic interactions. As for PS-PFES, the Fe atom in the PFES domains can be converted into Fe nanoparticles, which may serve as an alternative for the creation of conductive islands that are organized in patterns as they are formed. In all these options, the PS as the first block can be replaced with a polyisoprene (PI), polybutadiene PBD), or poly(ethylene-propylene) (PEP), which are all hydrophobic in nature and provide a chemical contrast to the second block.

Figure 6A:
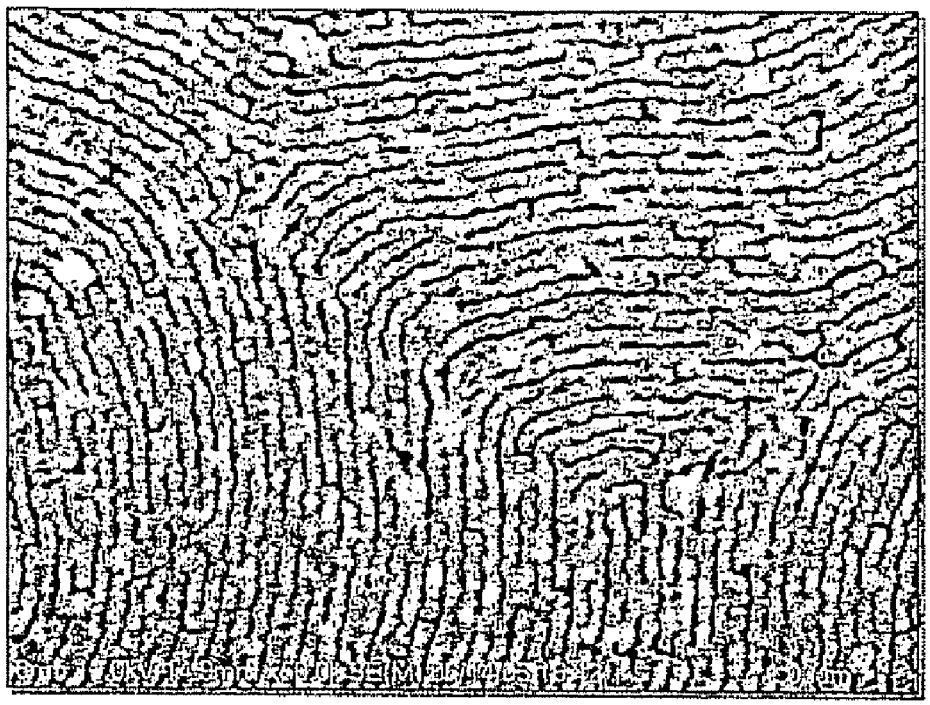
FIGS. 6A and 6B show scanning electron micrograph images of nanoscale conductive metal patterns.
Figure 6B:
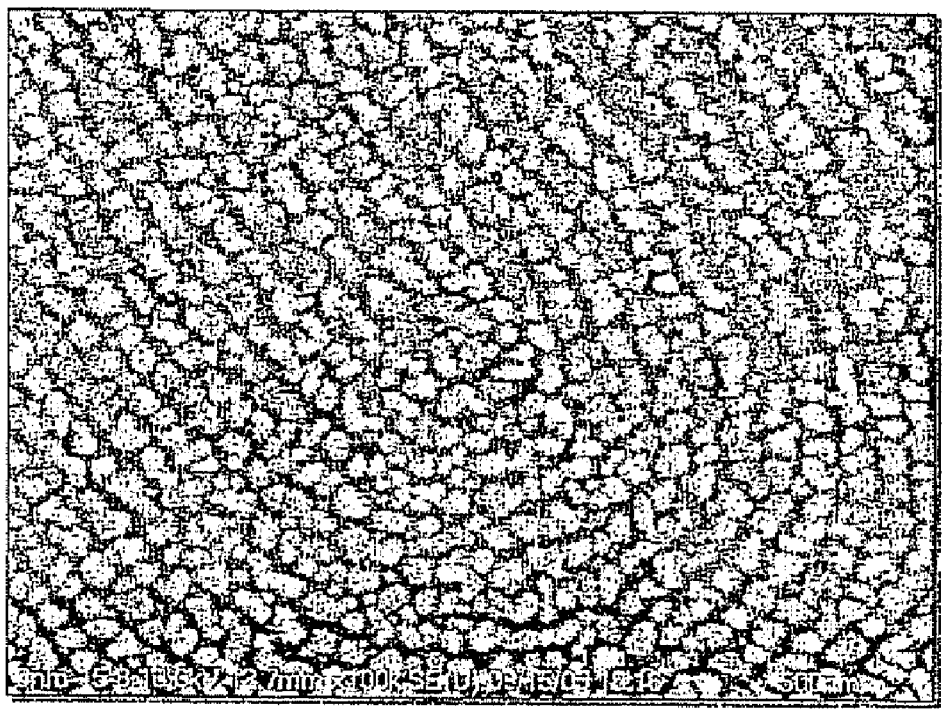

Let us now consider the known techniques of creation of conductive nanoscale metal patterns. In this connection, reference is made to FIGS. 6A and 6B showing scanning electron micrograph images of nanoscale conductive metal patterns. Thermal evaporation of metal atoms (e.g., silver) onto the microphase-separated block copolymer film results in preferential segregation of the metal atoms on top of one type of the block copolymer domains, forming metal islands or a wire network with typical dimensions approximately 10-30 nm. The amount of the evaporated metal dictates the morphology and conductivity of the resulting network. FIG. 6A shows a network of conductive nanoscale metal wires that reflect the underlying blocks copolymer thin film. FIG. 6B was obtained by evaporating a smaller amount of metal onto the polymer film, resulting in isolated islands that, nevertheless, mimic the block copolymer pattern.

Figure 7:
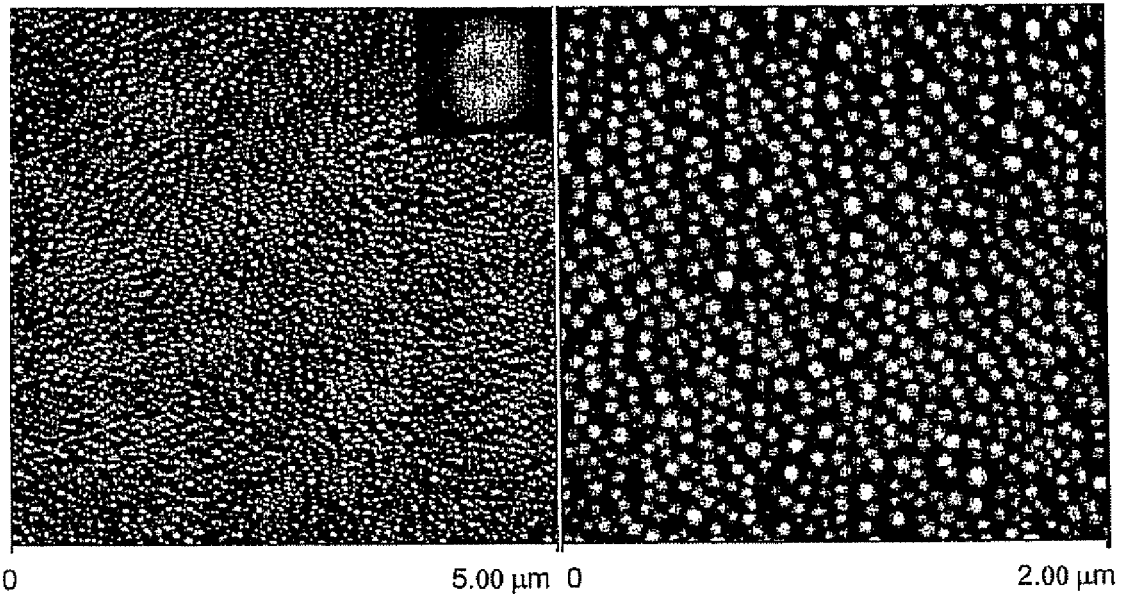
FIG. 7 shows scanning probe micrograph image of droplets of vitrified poly(3,4-ethylenedioxythiophene)/poly(4-styrene sulfonate) (PEDOT/PSS) domains on top of a block copolymer structure.

The present invention provides for the creation of conductive nanoscale PEDOT/PSS pattern, using for example the same template as in the above-described example. An aqueous solution of the conducting polymer poly(3,4-ethylenedioxythiophene)/poly(styrene sulfonate) (PEDOT/PSS) is deposited through a filter and spin coated on top of the thin film. Droplets of vitrified PEDOT/PSS, 8 nm in height, form on top of the hydrophilic block copolymer domains arranged in lines according to the pattern of the block copolymer, as shown in FIG. 7. This figure shows the scanning probe micrograph image of 20 nm height contrast; inset shows the 2D Fourier Transform with a narrow ring corresponding to 48 nm.

By changing the solution parameters, the length scale of the block copolymer and its composition, it is possible to tune the PEDOT structure from small droplet to elongated lines and finally to an amorphous network.

As indicated above, the present invention provides for utilizing block copolymer films in transistors to enhance the charge mobility. Current efforts in microelectronics are concentrated on developing new dielectric insulator materials for OTFT that will enhance device performance [11, 12]. The inventors used PS-b-PMMA block copolymer to define the top surface of the OTFT dielectric insulator (it was placed on top of a thin $SiO_2$ layer). The inventors have found that the mobility was enhanced and exceeded 1 $cm^2V^{-1}s^{-1}$. The accompanying effect was a threshold voltage reduction by a factor of 5 (compared to using $SiO_2$ alone as the dielectric insulator).

It should be noted that the block copolymer insulating layer can be used as an additional insulating layer or as a single insulating layer. The block copolymer film can affect the morphology or the ordering (or crystalline grain size) of the closest organic semiconductor layers, and by that enhance the charge carrier mobility in the TFT channel. For $C_{60}$ OTFT with $SiO_2$/block copolymer insulator, the results axe well above the best $C_{60}$ OTFT results reported in literature [13], and are among the best N-type organic transistors known in publication.

Figure 8:
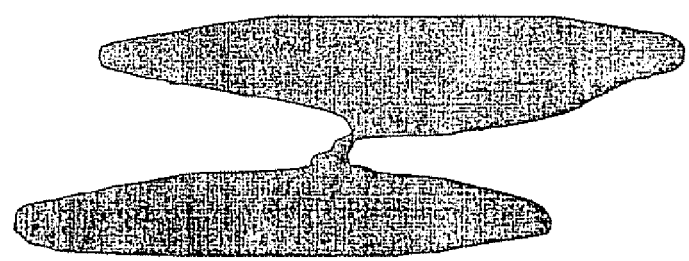
FIG. 8 shows schematic description of a percolation network at threshold.

As indicated above, the invention also provides for a novel lateral-structure transistor, in which a patterned electrically conductive layer in the form of spaced-apart electrically conductive regions is used in association with a transistor channel element. In this connection, reference is made to FIG. 8 showing schematic description of a percolation network at threshold. The best performance of a sub-percolation conductive network requires the network to be brought very close to its threshold but to be kept below it so as to avoid an electrical short. As shown in FIG. 8, the first percolation path that is formed is typically very thin and takes up very little space.

In the lateral transistor structure of the present invention, a patterned electrically conductive layer is provided in the close proximity of the channel region (gap) between source and drain electrodes.

Figure 9A:
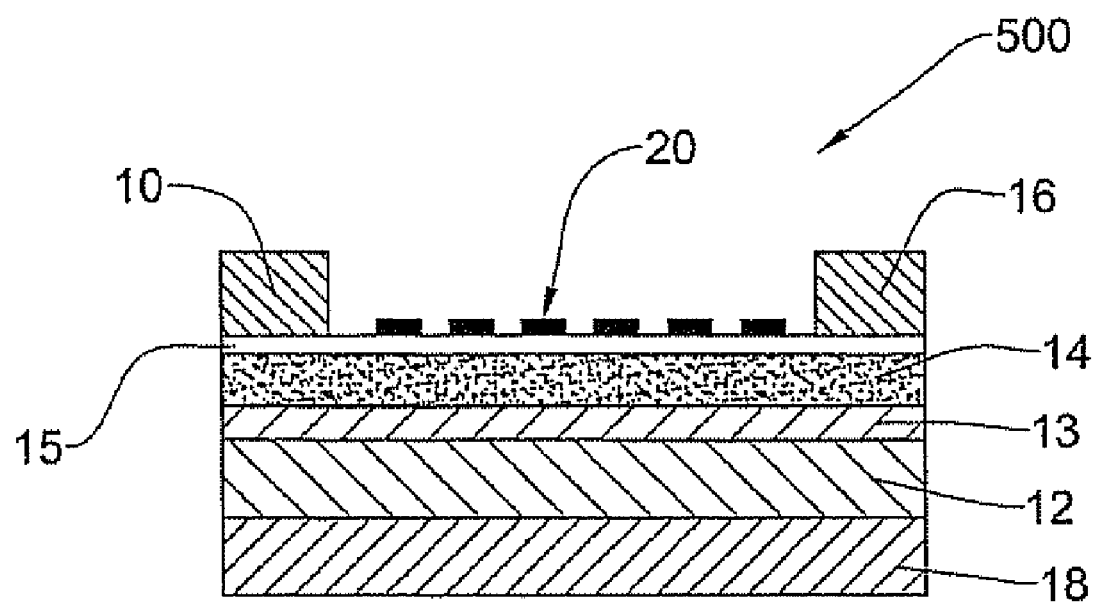
FIGS. 9A and 9B show two examples, respectively, of a lateral configuration transistor device of the present invention.
Figure 9B:
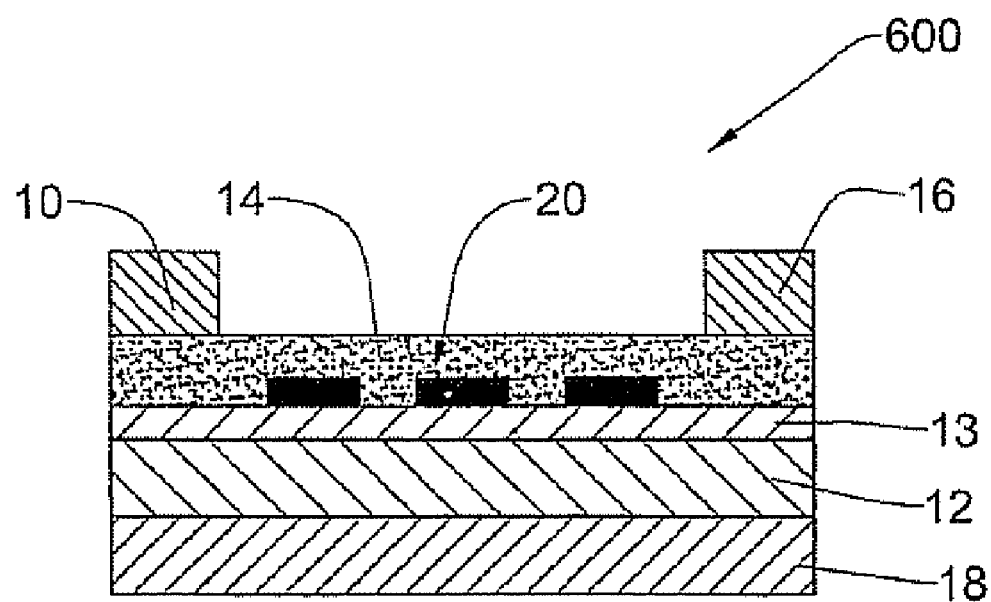

In this connection, reference is made to FIGS. 9A and 9B showing two examples, respectively, of a lateral transistor structure according to the invention. In the example of FIG. 9A, a transistor structure 500 includes a substrate layer 18 (e.g. $SiO_2$); a gate electrode 12 on top of the substrate; an insulator layer 13; a channel layer 14 (e.g. semiconductor or polymer); a patterned electrically conductive layer 20 in the form of spaced-apart metal islands above the channel 14; and a source and a drain electrodes 10 and 16 in the upper layer. The islands may be located directly on top of the channel layer 14, or may be separated therefrom by a thin insulator layer 15. As indicated above, the provision of this thin insulator allows for optimizing the current injection from the islands into the channel. Spacing between the islands varies across the patterned region such that length-dependent effects would be minimized and/or averaged out.

FIG. 9B shows a generally similar lateral transistor structure 600, which distinguishes from the above-described example in that a patterned electrically conductive layer 20 is located below a channel layer 14. This, transistor 600 includes a substrate layer 18 (e.g. $SiO_2$); a gate electrode 12 on top of the substrate; an insulator layer 13; the patterned electrically conductive layer 20 in the form of spaced-apart metal islands; the channel layer 14 (e.g. semiconductor or polymer); and a source and a drain electrodes 10 and 16 in the upper layer.

Figure 9C:
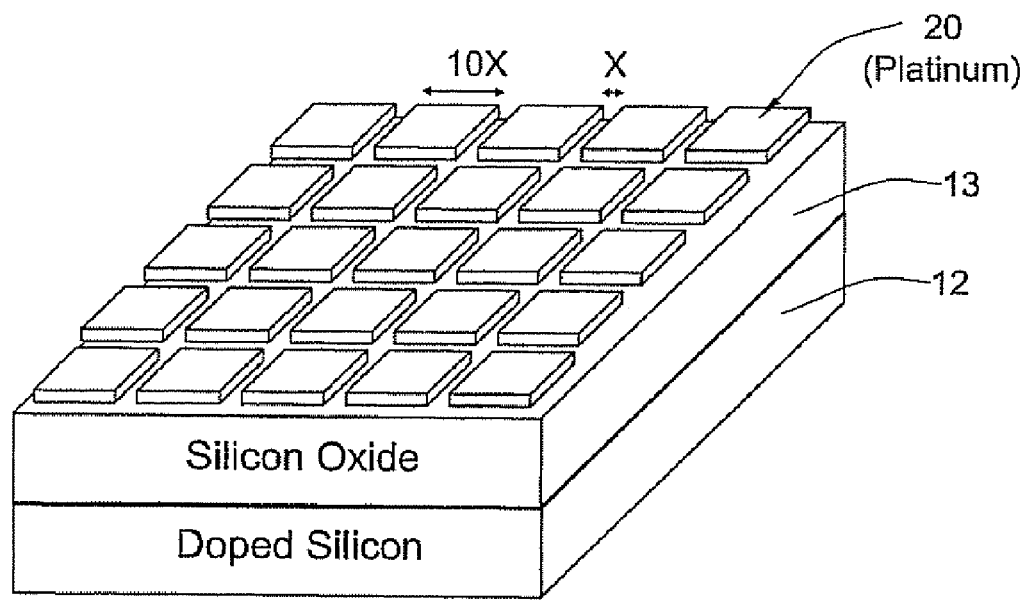
FIGS. 9C and 9D show an example of the implementation of the transistor device of FIG. 9B.
Figure 9D:
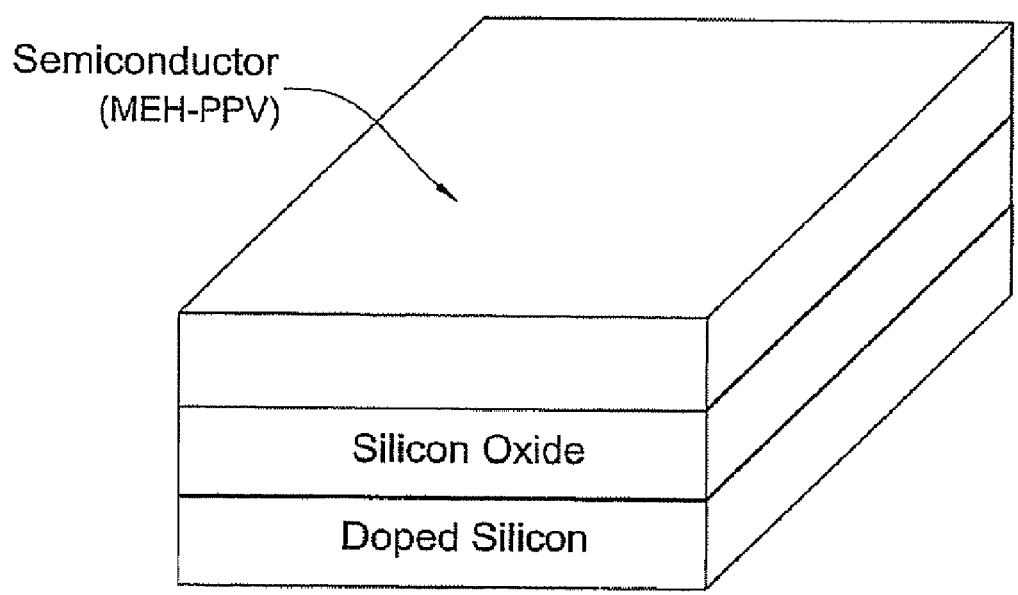

FIGS. 9C-9D show more specifically the fabrication of a transistor device similar to that of FIG. 9B. As shown in FIG.

9C, a gate electrode 12 is first provided, then an insulating layer of SiO$_2$ 13 is deposited on the gate layer 12. Thereafter, a patterned electrically conductive layer 20 is provided on the insulator 13, either by direct deposition and patterning by lithography, or through the use of an appropriate organic layer and selective deposition as described above. In the present example, the layer 20 is made of platinum, the island size is 10x where x is a distance between the islands. Then, as shown in FIG. 9D, a semiconductor (channel) layer 14 is deposited on the patterned layer 20.

Figure 10B:
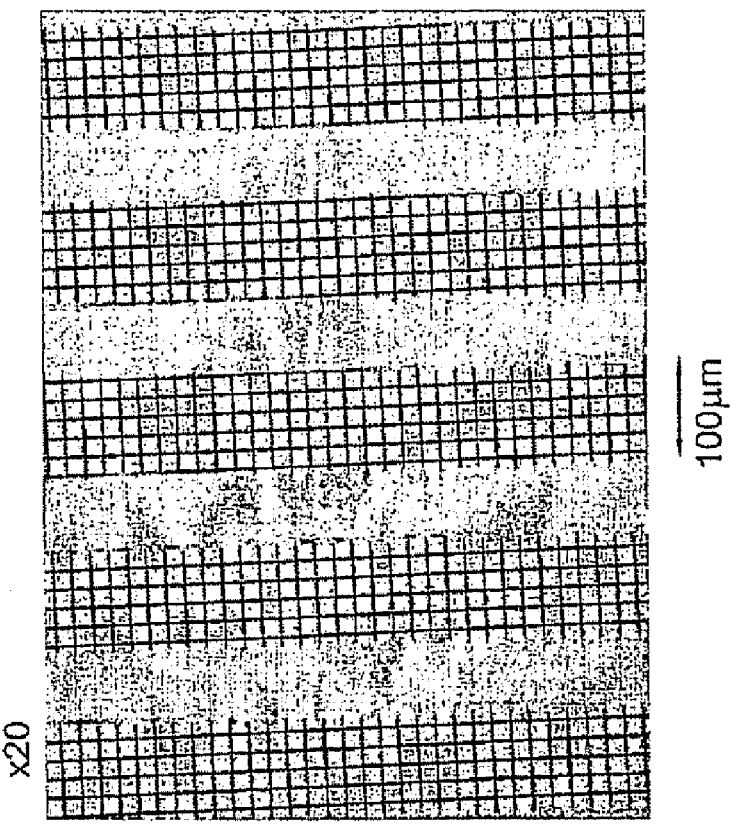
FIGS. 10A and 10B show more specifically the patterned layer matrix and a source and drain matrix thereon, respectively.
Figure 10A:
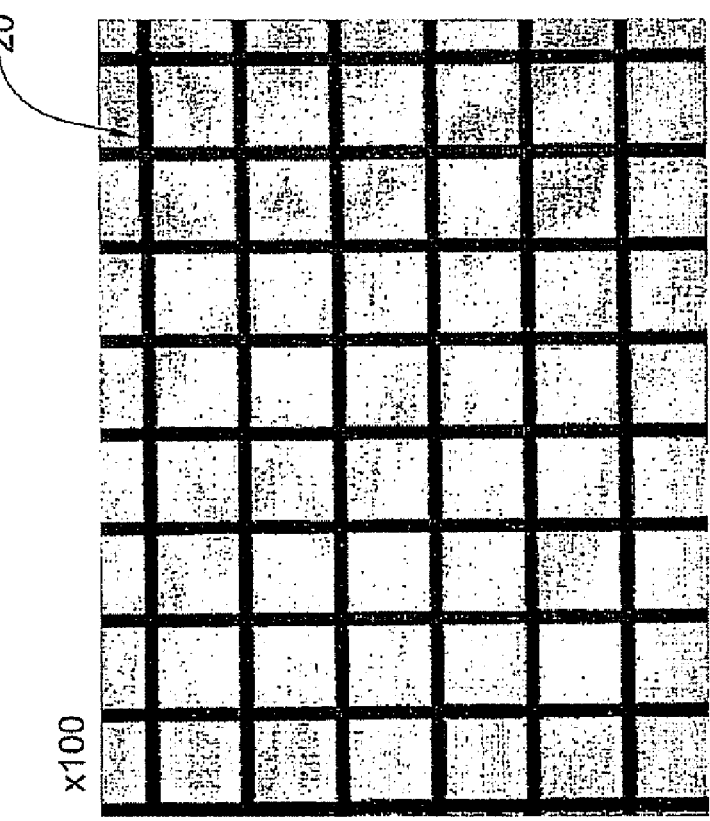

FIGS. 10A and 10B show microscope images of, respectively, an islands matrix 20 and the same with the source/drain layer thereon.

Figures 11A, 11B:
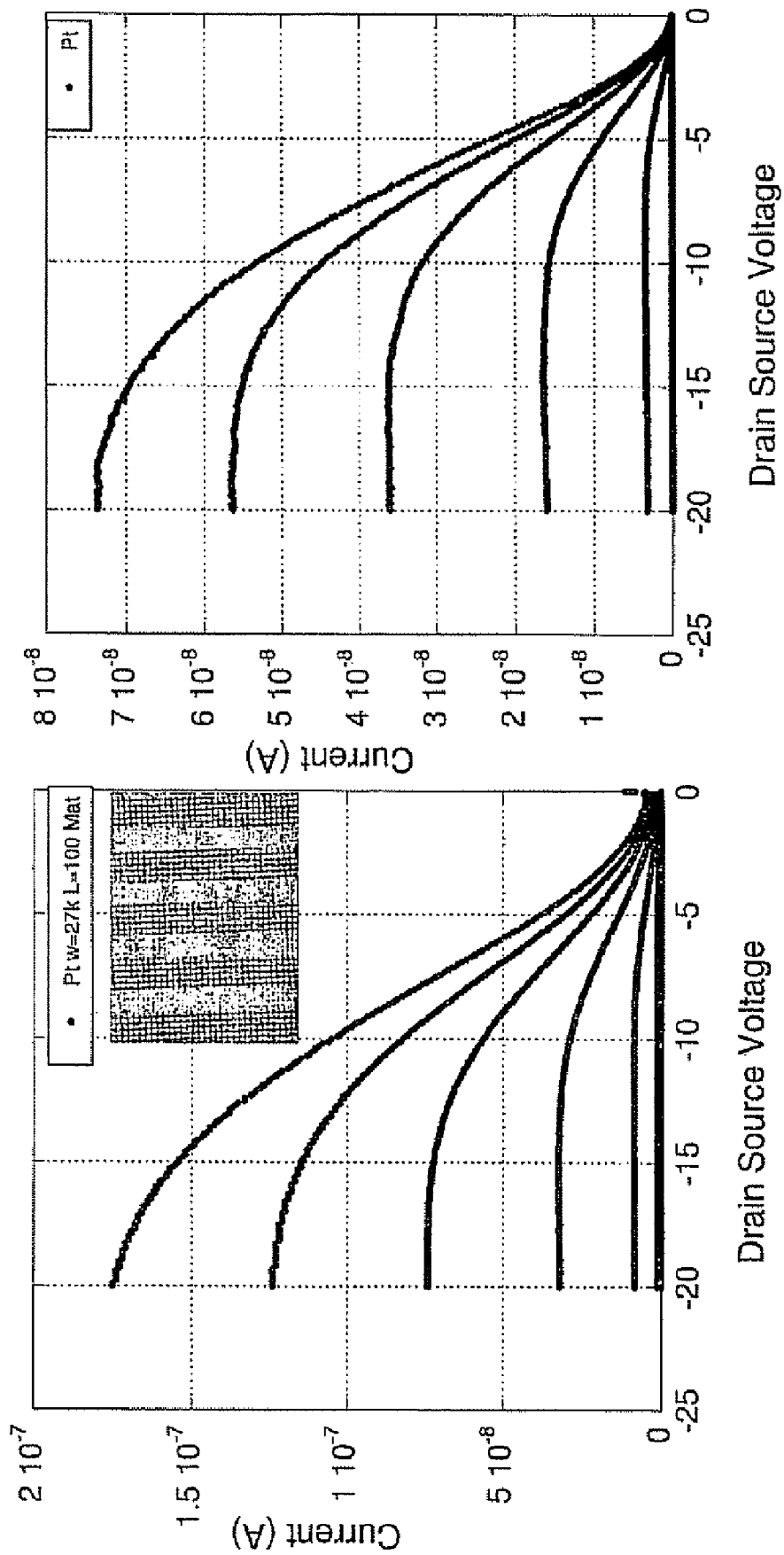
FIGS. 11A to 11C show the characteristics of the transistor device of the present invention as compared to the conventional one.
Figure 11C:
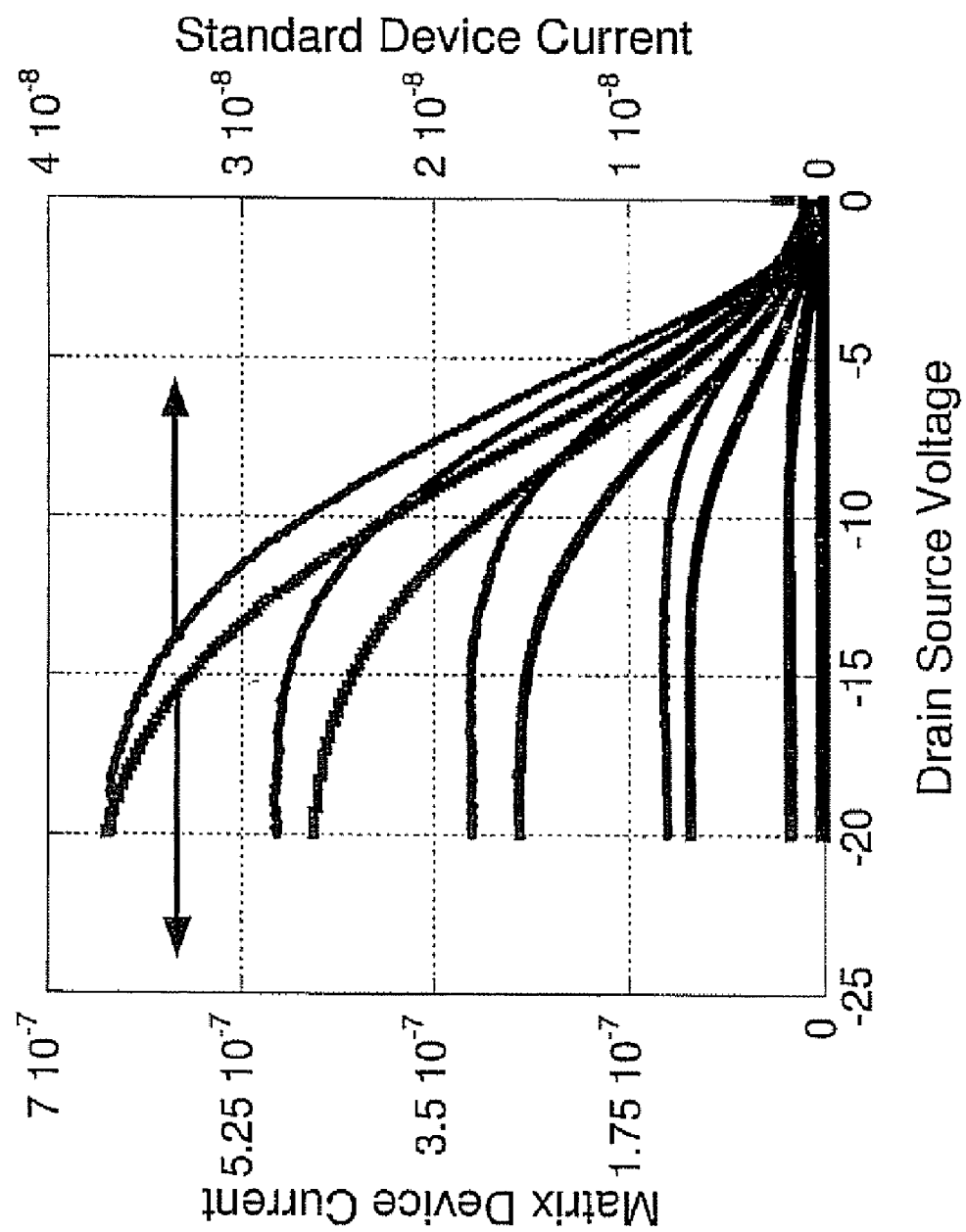

FIGS. 11A-11C compare the results obtained with the lateral transistor structure of the present invention to those of the standard lateral FET. FIG. 11A shows the electric current through the transistor as a function of drain/source voltage for the FET of the present invention using a matrix of 27000 μm width and 100 μm length, and FIG. 11B shows a similar function for the standard FET using a matrix of 10000 μm width and 5 μm length. FIG. 11C shows the normalize current to the width/length ratio. The inventors expected to obtain 10 times enhancement, but the results showed even 16 times enhancement, as compared to the conventional transistor.

The pattern of the spaced-apart electrically conductive regions in a layer above or below the channel is preferably a two dimensional pattern. This is aimed at preventing effects of local defects onto the entire structure.

Figure 12A:
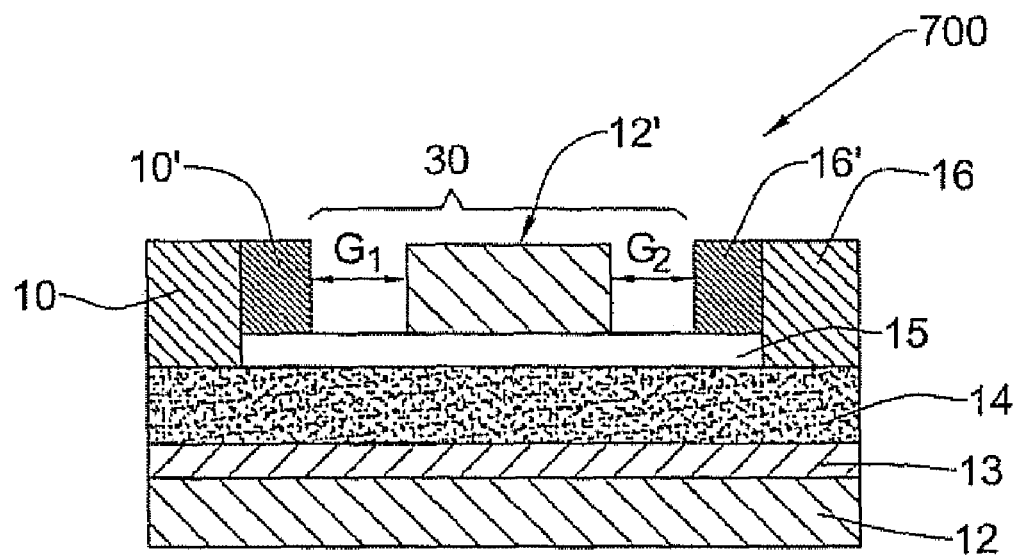
FIGS. 12A and 12B show two more examples, respectively, of a lateral configuration transistor device of the present invention.
Figure 12B:
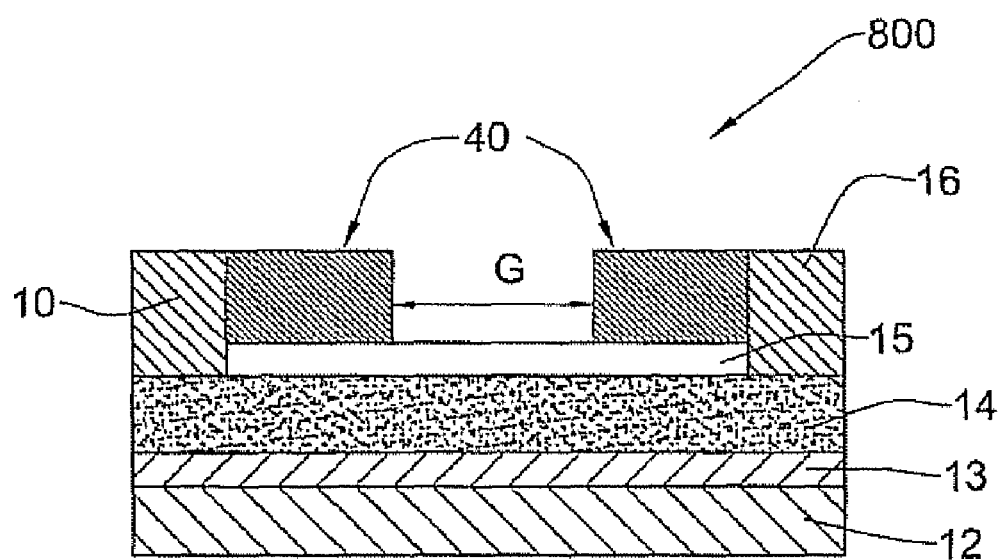

Reference is now made to FIGS. 12A and 12B showing two more examples of the lateral transistor of the present invention. These examples are distinct from the previously described ones in that an effective length of the transistor channel is reduced by reducing a gap G between the source and drain electrodes. A transistor 700 includes a gate electrode 12, an insulator 13, a channel layer 14, an insulator 15, source and drain electrodes 10 and 16 in direct contact with the channel layer 14, and a patterned electrically conductive layer 30 spaced from the channel 14 by insulator 15. The patterned electrically conductive layer 30 is formed by regions 10' and 16' of the source and drain electrodes spaced from the channel by the insulator 15, and an electrically conductive region 12' of the same layer therebetween. This region 12' presents the so-called "floating gate", which is not intended for any active potential supply, but serves to short the potential in the channel 14 due to the 2D nature of the device. The gap G between the source and drain is thus formed by gaps G$_1$ and G$_2$ in between the source and drain and the floating gate. It is important that the top insulator 15 as well as the channel 14 is very thin compared to the source-drain distance (at least order of magnitude less) so that a true 2D structure is created. For example, for a 5 micron source-drain distance, the thickness is preferably below 500 nm and more preferably below 100 nm. It should be noted that the top insulator 15 need not be a perfect insulator as it would not contribute to leakage currents at the OFF state.

FIG. 12B shows a transistor 800, in which, due to the provision of the top insulator 15, a gap G is reduced by creating a patterned electrically conductive layer 40 above the insulator 15 where the layer 40 is formed by extending either one or both of the drain and source layer regions towards one another above layer 15. It should be noted that the insulator layer 15 between the channel and the source/drain layer is designed to create a field dependent contact to the channel such that the extended source/drain regions would inject at the ON state and be isolated at the OFF state.

As indicated above, the present invention in some of its embodiments utilizes block copolymers to create conducting patterns that are predetermined and have very small gaps across the entire device so that the effective gap is indeed very small.

Figure 13A:
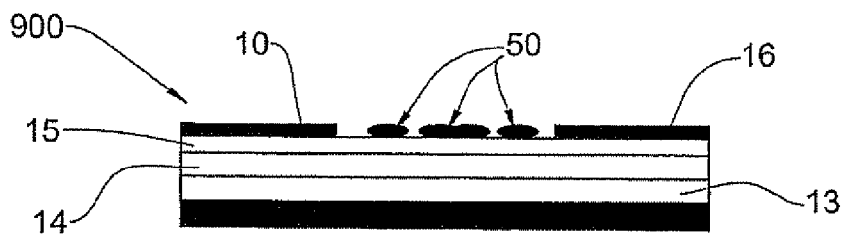
FIGS. 13A and 13B show the side and top views of a lateral FET of the present invention having conductive regions in between the source and drain electrode.
Figure 13B:
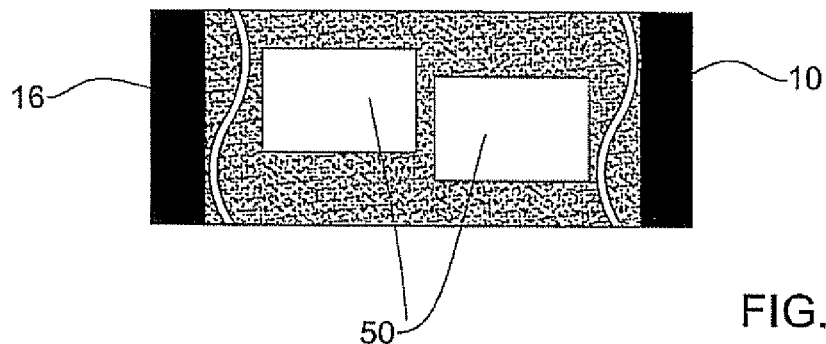

The invention thus employs controlled patterns afforded trough block so copolymer thin film technology, which rely on adhesion forces rather than based on the conventional percolation method. This enables to create a high density (filling factor) of conducting regions, which create a pattern that is non-uniform on the nanoscale but appears uniform on the micron scale (the relevant scale for low cost transistors). This is illustrated in FIG. 13A and FIG. 13B which show the side and top views of a lateral FET 900 having conductive regions 50 in between the source and drain electrodes 10 and 16. An insulator 15 between the channel 14 and islands 50 is a block copolymer. FIG. 13B is a zoom in on a small region which illustrates that the conductive region takes much larger space ten the non conducting region.

The invention can be used in light-sensitive switchable organic TFT (OTFT). Lateral C$_{60}$ OTFTs are light sensitive. The photon energy enhances the current injection to the C$_{60}$ active layer and/or releases trapped charges in the insulator-semiconductor interface. Illumination can enhance the OTFT current by three orders of magnitude, while the device on/off state is controlled by the gate electrode. By employing the non-continuous metallic film ("metallic" signifies also a conducting polymer), the conductance of the channel is enhanced and the effect of the contacts is dramatically enhanced making the device "useful".

Figure 14:
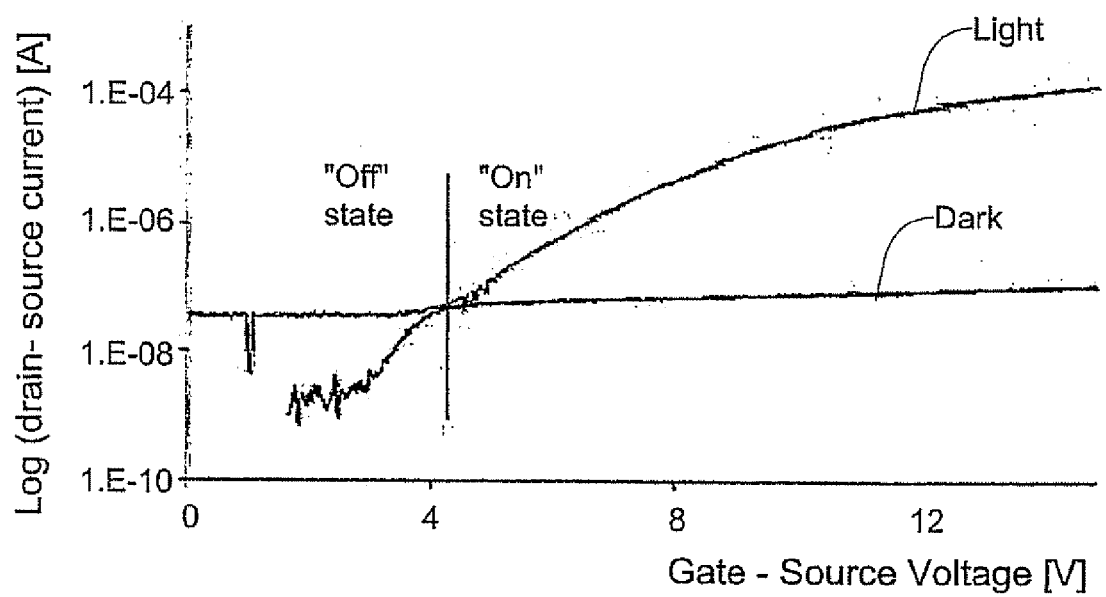
FIG. 14 shows the transconductance characteristics of a light sensitive switchable OTFT, for dark (blue) and illuminated (pink) samples, measured at $V_{DS}=18V$.

The light sensitive switchable OTFT may be used for large area sensor array as a full-page tablet scanner or as digital X-Ray plates. FIG. 14 shows the light sensitive switchable OTFT transconductance characteristics for dark (blue) and illuminated (pink) samples, measured at V$_{DS}$=18V.

Reference is made to FIGS. 15A to 15E showing five examples, respectively, of a lateral configuration TFT of the present invention utilizing amorphous silicon for the channel material.

Figure 15A:
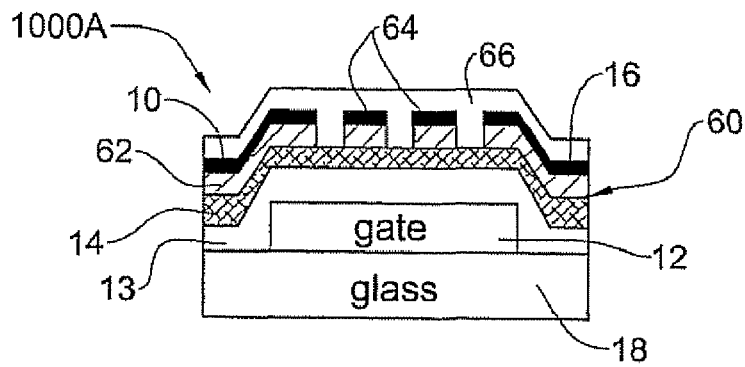
FIGS. 15A to 15E show five examples, respectively, of a lateral configuration TFT of the present invention utilizing amorphous silicon for the channel material.

TFT 1000A shown in FIG. 15A includes a glass substrate 18, a gate electrode 12 on top of the substrate covered by a dielectric (insulator) layer 13 (e.g. silicon nitride or silicon oxide), a channel layer 14 of amorphous silicon, a metal layer 60 patterned to define source 10 and drain 16 electrodes above the channel layer, and an upper protection layer 66 (passivation made for example of polymer or silicon oxide). As shown in the figure, a layer 62 of n+ a-Si is provided and appropriately patterned to define n+ a-Si between the a-Si channel layer and the source and drain electrodes. This layer 62 improves ohmic contact between a-Si layer 14 and metal layer 60. As further shown in the figure, layers 60 and 62 are patterned to define spaced-apart electrically conductive regions (islands) 64 in between the source and drain electrodes regions. Thus, in this example, the patterned electrically conductive layer associated with the transistor channel is formed by the layer structure from which the source and drain electrodes and the n+ a-Si regions are formed. The regions 64 are two-layer stacks.

Figure 15B:
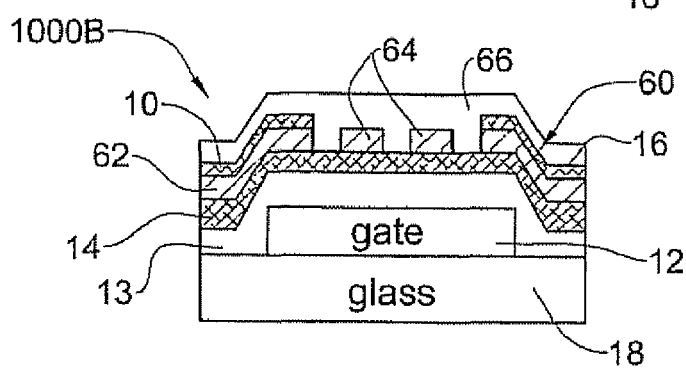

FIG. 15B shows a transistor 1000C which is configured generally similar to that of FIG. 15A, but in which regions 64 are single-layer regions formed by n+ a-Si material. This layer 62 typically has an electrical conductivity higher than that of a-Si 14 and lower than that of metal 60.

Figure 15C:
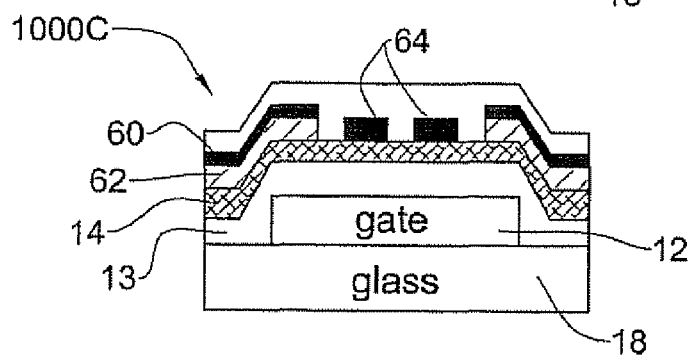

FIG. 15C shows a transistor 1000C which differs from the configuration of FIG. 15B in that electrically conductive region 64 above the channel and between the source and drain electrodes are single-layer regions formed of the electrodes material located on top of the channel layer (with no n+ a-Si material therebelow). This can for example be achieved by double etching, to first remove the n+ a-Si material within a region in between the source and drain electrodes, and then to pattern the metal layer in said region.

Figure 15D:
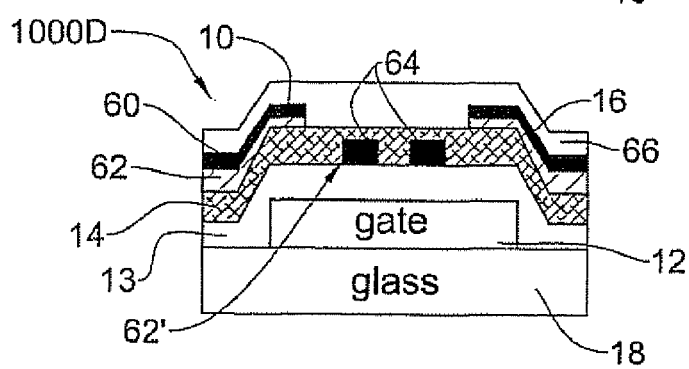

FIG. 15D illustrates a transistor 1000D including a glass substrate 18, a gate electrode 12 on top thereof and covered by insulator 13, a first n+ a-Si layer 62' patterned to define spaced-apart n+ a-Si regions 64, a channel layer 14, a second n+ a-Si layer 62 and a metal layer 60 thereabove. Layers 60 and 62 are patterned to define source and drain electrodes 10 and 16 spaced from the channel layer 14 by regions of n+ a-Si layer 62. Thus, in this example, the patterned electrically conductive layer associated with the channel region is located below the channel region.

Figure 15E:
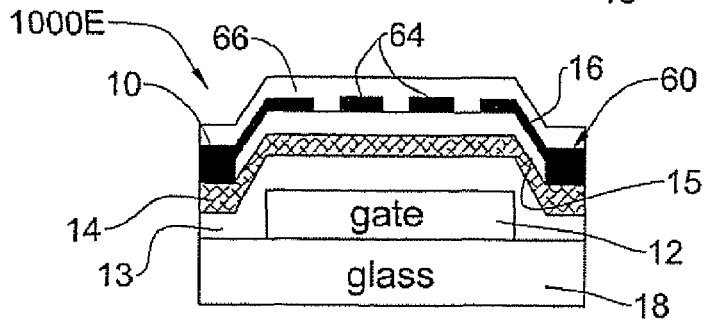

FIG. 15E shows a transistor structure 1000E which is generally similar to the configurations of FIGS. 15A-15C in which a patterned electrically conductive layer 64 associated with the channel 14 is located above the channel region, but which has a thin insulating layer 15 between the channel layer 14 and said patterned electrically conductive layer 64.

Figure 16A:
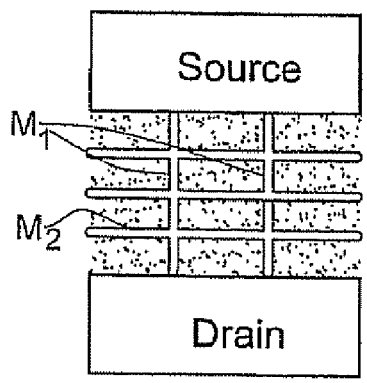
FIGS. 16A to 16E show, in a self-explanatory manner, different examples for a pattern in the electrically conductive layer associated with the transistor channel.
Figure 16B:
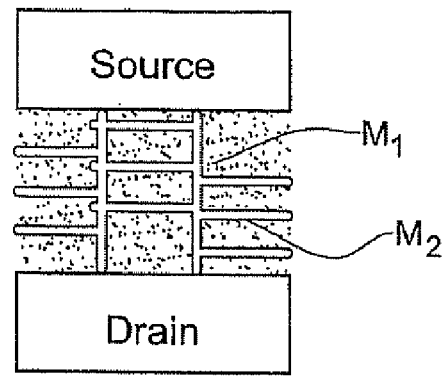
Figure 16C:
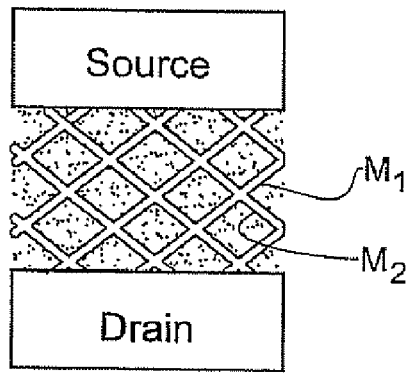
Figure 16D:
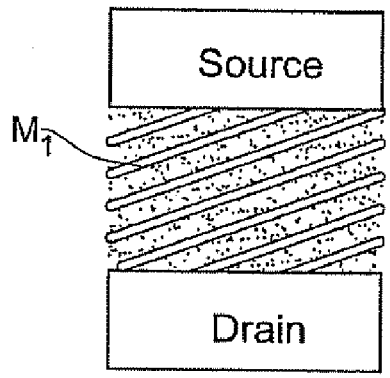
Figure 16E:
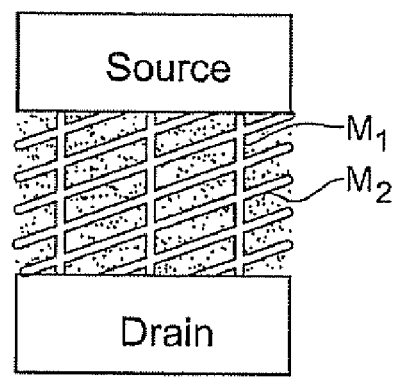

Reference is made to FIGS. 16A to 16E showing, in a self-explanatory manner, different examples for a pattern in an electrically conductive layer associated with the transistor channel. In these examples, the patterned electrically conductive layer is in the form of a mesh (grid), where the grid elements may include elements $M_1$ extending along the channel (FIGS. 16A, 16B and 16E) or extending at a certain oblique angle (about 45°) to the channel axis (FIGS. 16C, 16D), or both (FIG. 16E). It should be noted that conducting regions extending across the channel (regions $M_2$ in FIGS. 16A, 16B, 16C and 16E, and regions $M_1$ in FIGS. 16C and 16D) serve also as a charge reservoir that could passivate deep traps including those generated during the device operation thus enhancing its stability (in a-Si it is known that defects such as hydrogen deficiency occur during device operation and create threshold voltage shift).

The following are some examples of the patterning technique suitable to be used in the invention to define the spaced-apart electrically conductive regions in close proximity with the channel for lateral transistor configuration.

The pattern may be created by patterning a resist layer over a channel, using laser interference to develop resist and achieve a micron or sub micron pattern without mask or contact; or using embossing from a hard or soft mask to form a high resolution etch mask. In some other embodiments, an etch mask or a resist patterning mask can be formed using dewetting of a sub continuous liquid deposited layer.

Isolated metal islands may be produced as conductors and/or etch masks by evaporating or sputtering metal at a thickness, rate, substrate temperature, etc. such that discontinuous island growth of the deposited metal is maintained.

A multicomponent, phase separating blend resist material may be utilized such that one phase form-s isolated islands in a matrix of the second phase in 2D arrangement. The matrix could be selectively dissolved, etched or otherwise removed and the remaining islands used as a pattern. In some other embodiments, a similar blend technique may be used but where one phase is a conductor; or where one phase contains metal nanoparticles.

The patterning may be applied to metal and/or n+ layer over the channel using microcontact printing. In some other embodiments, a similar technique can be used but where the contact patterned material is a self-assembled monolayer (SAM).

Patterning can be applied to a channel conductor using self assembled block copolymers to form a lamellar or island type network in 2D arrangement to be used as an optical mask to develop resist, or to be selectively etched and used for subsequent etch pattern transfer.

In some other embodiments of an organic, polymer semiconductor or solution processed inorganic transistor, the channel may be a phase separating blend of isolated conducting domains in a semiconducting matrix.

As indicated above, the present invention in its second aspect, provides for reducing the effective length of the transistor channel by creating a pattern within the channel in the form of a two dimensional array of spaced apart region of a material having higher electric conductivity than that of the channel material. Such a two-dimensional conducting pattern can be imprinted into the channel material by an additive process such as doping.

Figure 17A:
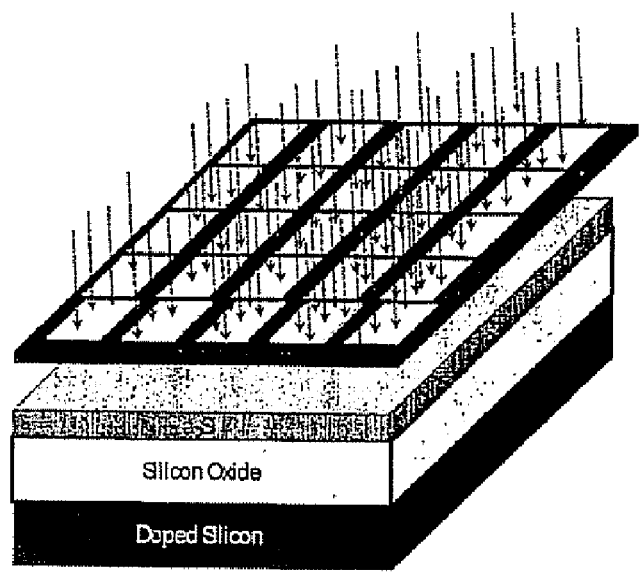
FIG. 17A schematically illustrates an example of a doping technique of the present invention for creating a two dimensional array of doped region within a transistor channel.
Figure 17B:
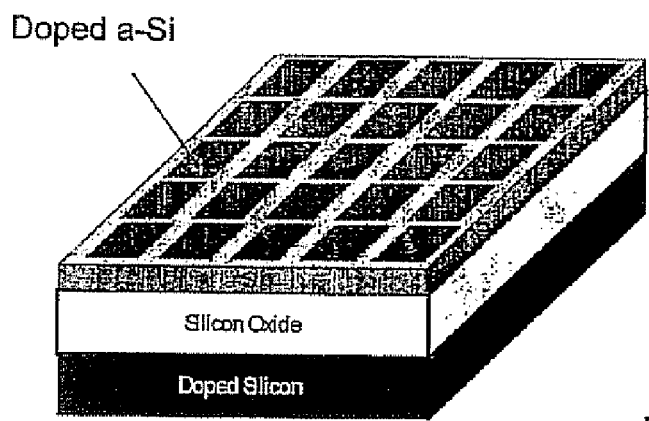
FIG. 17B schematically illustrates the resulting structure obtained with the technique of FIG. 17A.

FIG. 17A exemplifies doping through a shadow mask of a-Si thus creating the two dimensional conducting pattern using the know mechanism of dopant diffusion or ion bombardment. The mask needs not be a physical shadow mask, and the same effect can be achieved using other photolithographic methods. In the case of silicon type (inorganic crystalline), the dopant atoms are chosen using the periodic table of elements from columns that are adjacent to the columns where Si resides (as Al or P). An example of the resulting structure is shown in FIG. 17B.

Figure 17C:
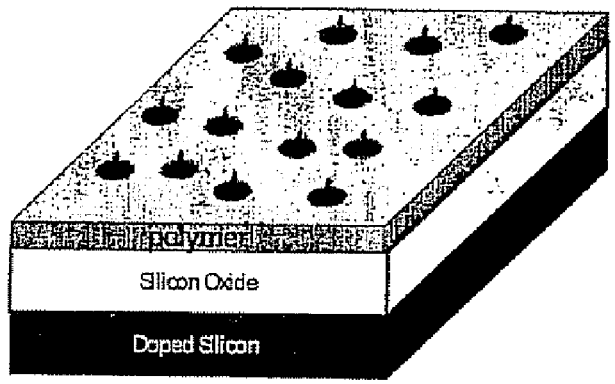
FIG. 17C illustrates another example of a doping technique of the present invention for creating a two dimensional array of doped region within a transistor channel.

Alternatively, especially in the case of organic materials, as an example the dopants can be printed onto the semiconducting channel directly and allowed to diffuse inside. This is illustrated in FIG. 17C in a self explanatory manner. In the case of organic molecules, the dopants would typically be molecules that are electron (hole) rich and have the tendency to donate (withdraw) electrons with respect to the channel material. Suitable dopants for a variety of organic semiconductors are abundant in the scientific literature. As an example, the cationic dye pyronin B chloride is studied as a dopant in a 1,4,5,8-naphthalene tetracarboxylic dianhydride (NTCDA) film. Another example is in the case of thiophene materials, where sulfonated compounds, such as oxygen, etc., can be used.

Thus, the present invention provides a novel approach for improving the performance of a transistor structure and accordingly of the devices using such transistors. The invention consists of providing a layer formed by an array (preferably two-dimensional array) of spaced-apart electrically conductive regions, presenting a layer of non-continuous electrical conductivity, in association with a transistor active element; or in providing a pattern in the form of a two dimensional array of spaced-apart regions of higher electrically conductive material inside the channel material of a lower electrical conductivity.

In the vertical transistor structure, such a discontinuity of electrical conductivity is implemented in the transistor electrode (e.g. source electrode), which is made porous (patterned to define holes surrounded by metal regions), namely presents a network (grid) of metal stripes. This solution enables the gate electric field to penetrate through the source electrode, enabling its flux to control the injection current from the source electrode into the semiconductor material. Preferably, a block copolymer is used to create the source electrode in this network pattern: the block copolymer is used as an insulator material and as template for the source (or drain) electrode; the tin and porous metal source electrode is located on top of the block polymer template. In the lateral transistor structure, the discontinuity of electrical conductivity is implemented in association with the transistor channel, and is achieved by providing an array of spaced-apart electrically conductive regions in close proximity to the channel. These regions may be a layer above or below the channel; which layer may be directly below or above the channel or spaced therefrom by a thin insulator layer; these regions may be a layer between the channel and a source/drain containing layer or may be made in the same source/drain containing layer.

Those skilled in the art will readily appreciate that various modifications and changes can be applied to the embodiments of the invention as hereinbefore exemplified without departing from its scope defined in and by the appended claims.

The invention claimed is:

1. An electronic device comprising active elements comprising a source electrode, a drain electrode, and a channel, wherein the source and drain electrodes are located in separate regions in a same layer, the channel is located in a region between the source and drain electrodes, and is associated with a patterned electrically-conductive layer, which has a pattern defining an array of spaced-apart regions of different electrical conductivity, forming discontinuity of electrical conductivity along said channel thereby increasing an electric current through the channel.

2. The device of claim 1, comprising a thin film transistor structure.

3. The device of claim 2, wherein said thin film transistor has a channel made of a semiconductor material.

4. The device of claim 2, wherein said thin film transistor has a channel made of a polymer material.

5. The device of claim 4, comprising a block copolymer layer serving as a substrate for said patterned electrically conductive layer.

6. The device of claim 5, wherein said block copolymer layer serves as a template for said pattern in the electrically conductive layer.

7. The device of claim 2, wherein said thin film transistor has a channel made of a polysilicon.

8. The device of claim 2, wherein the channel of said thin film transistor is made of amorphous silicon.

9. The device of claim 8, wherein said transistor structure comprises a gate electrode covered by an electrical insulator, the amorphous silicon channel layer on top of said electrical insulator, and a layer containing said source and drain electrodes above the channel with regions of n+ amorphous silicon in between the channel and the source and drain electrodes, said layer containing said source and drain electrodes being said patterned electrically conductive layer defining the array of spaced-apart electrically conductive regions within a region above the channel in between the source and drain electrodes.

10. The device of claim 9, wherein each of said spaced-apart electrically conductive regions is a stack formed by n+ amorphous silicon and metal on top thereof.

11. The device of claim 8, wherein said transistor structure comprises a gate electrode covered by an electrical insulator, the array of spaced-apart electrically conductive regions of said patterned electrically conductive layer on top of said electrical insulator, the amorphous silicon channel layer on top of said patterned electrically conductive layer, and source and drain electrodes above the channel with regions of n+ amorphous silicon in between the channel and the source and drain electrodes.

12. The device of claim 11, wherein said patterned electrically conductive layer is made of n+ amorphous silicon.

13. The device of claim 8, wherein said transistor structure comprises a gate electrode covered by a first electrical insulator, the amorphous silicon channel layer on top of said electrical insulator, a second electrical insulator layer on top of said channel layer, and a layer containing said source and drain electrodes above said second insulator such that the source and drain electrode have electrical contact to the channel, said layer containing said source and drain electrodes being said patterned electrically conductive layer defining the array of spaced-apart electrically conductive regions within a region above the channel in between the source and drain electrodes.

14. The device of claim 2, wherein said transistor device comprises a gate electrode, the channel with its associated patterned electrically conductive layer being located above said gate electrode and electrically insulated therefrom, and a layer containing said source and drain electrodes being located above the channel and having electrical contact thereto.

15. The device of claim 14, comprising an electrically conductive region serving as a second floating gate electrode located between and electrically insulated from the source and drain electrodes and from said channel element.

16. The device of claim 14, wherein said source and drain electrodes have extended regions thereof extending above corresponding regions of the channel element and electrically insulated therefrom.

17. The device of claim 14, wherein each of said spaced-apart electrically conductive regions is formed by n+ amorphous silicon.

18. The device of claim 14, wherein each of said spaced-apart electrically conductive regions is formed by metal.

19. The device of claim 2, wherein said transistor structure is configured and operable as a thin film transistor structure with source and drain electrodes arranged in different layers, said patterned electrically-conductive layer being either one of the source and drain electrodes.

20. The device of claim 19, wherein said patterned electrode is the source electrode located above a gate electrode, the source electrode metal being selected to operate as a barrier to charge injection into a semiconductor layer between the source and drain electrodes.

21. The device of claim 19, wherein said patterned electrode is the drain electrode located above a gate electrode, the source electrode metal being selected to operate as a barrier to charge injection into a semiconductor layer between the source and drain electrodes.

22. The device of claim 21, wherein said transistor structure comprises an additional layer structure between the source electrode layer and a channel element, said additional layer structure being configured to optimize the charge injection properties and/or enhance the chemical compatibility of the source and channel elements.

23. The device of claim 22, wherein said additional layer structure is a dielectric structure.

24. The device of claim 21, wherein said transistor structure comprises a dielectric structure placed between a channel element and the source electrode.

25. The device of claim 19, wherein the patterned electrode is a perforated metal layer.

26. The device of claim 19, wherein said transistor structure comprises a block copolymer configured to operate as an insulator material and as template for the patterned source or drain electrode.

27. The device of claim 26, wherein the transistor structure comprises a gate electrode, a gate dielectric structure on top of the gate electrode, a patterned layer of the source electrode on top of the gate dielectric structure and carrying a semiconductor channel element, and the top drain electrode, said gate dielectric structure including the dielectric and the block polymer thin film.

28. The device of claim 27, wherein the patterned source electrode is a perforated metal layer with perforations of a characteristic diameter comparable to the thickness of the semiconductor layer.

29. The device of claim 27, wherein said transistor structure is Si-based structure with Ag-electrodes.

30. The device of claim 27, wherein the source electrode is porous metal layer produced by nanoscale patterning of surface energy.

31. The device of claim 30, wherein the source electrode is configured as a network of metal stripes.

32. The device of claim 26, wherein the transistor structure comprises a gate electrode, a gate dielectric structure on top of the gate electrode, a patterned layer of the drain electrode on top of the gate dielectric structure and carrying a semiconductor channel element, and the top source electrode, said gate dielectric structure including the dielectric and the block polymer thin film.

33. The device of claim 1, wherein said electrically conductive layer is in the form of an array of islands of the electrically conductive material arranged in spaced-apart relationship along the region between the source and drain electrodes above said channel.

34. The device of claim 33, wherein said array extends along at least one axis inclined with respect to an axis of the channel.

35. The device of claim 1, wherein said electrically conductive layer is in the form of an array of islands of the electrically conductive material arranged in spaced-apart relationship along the region between the source and drain electrodes below said channel.

36. The device of claim 1, wherein said electrically conductive layer is in the form of an array of elongated regions of the electrically conductive material arranged in spaced-apart relationship along the region between the source and drain electrodes above said channel.

37. The device of claim 1, wherein said electrically conductive layer is in the form of the array of elongated regions of the electrically conductive material arranged in spaced-apart relationship in the region along the channel element below said channel element.

38. The device of claim 1, wherein said pattern is in the form of a two-dimensional array of the regions of different electrical conductivity.

39. A lateral configuration thin film transistor device comprising source and drain electrodes located in separate regions of a same layer, and a channel element located in a region between the source and drain electrodes, said channel element having a pattern forming discontinuity of electrical conductivity along the channel, the pattern comprising a two-dimensional array of spaced-apart regions of a material of higher electrical conductivity spaced by regions of lower electrical conductivity.

40. The device of claim 39, wherein said channel element comprises a layer of the first, lower electrical conductivity material selectively doped with a second material of the higher electrical conductivity within said spaced-apart regions arranged in the two-dimensional array.

41. The device of claim 39, wherein said channel element comprises a first continuous layer of the lower electrical conductivity material, and a second layer located close to said first layer and being patterned to define said two dimensional array of the regions of the higher electrical conductivity material.

42. The device of claim 41, wherein said second patterned layer is located between the first layer and the source and drain containing layer.

43. The device of claim 42, comprising an insulating layer between the first layer and the patterned second layer.

44. The device of claim 41, wherein said second patterned layer is located below the first layer, on top of a gate insulator layer.

* * * * *